(12) United States Patent
Ranta et al.

(10) Patent No.: US 10,475,720 B2
(45) Date of Patent: Nov. 12, 2019

(54) S-CONTACT THERMAL STRUCTURE WITH ACTIVE CIRCUITRY

(71) Applicant: pSemi Corporation, San Diego, CA (US)

(72) Inventors: Tero Tapio Ranta, San Diego, CA (US); Simon Edward Willard, Irvine, CA (US)

(73) Assignee: pSemi Corporation, San Diego, CA (US)

( * ) Notice: Subject to any disclaimer, the term of this patent is extended or adjusted under 35 U.S.C. 154(b) by 0 days.

(21) Appl. No.: 15/853,603

(22) Filed: Dec. 22, 2017

(65) Prior Publication Data

US 2019/0198414 A1 Jun. 27, 2019

(51) Int. Cl.
| | |
|---|---|
| *H01L 23/367* | (2006.01) |
| *H01L 23/373* | (2006.01) |
| *H01L 23/522* | (2006.01) |
| *H01L 21/48* | (2006.01) |

(52) U.S. Cl.
CPC ........ *H01L 23/367* (2013.01); *H01L 21/4871* (2013.01); *H01L 23/3735* (2013.01); *H01L 23/3738* (2013.01)

(58) Field of Classification Search
CPC ..... H01L 23/36; H01L 23/367; H01L 23/373; H01L 23/3735; H01L 23/3738; H01L 21/4871; H01L 21/4875; H01L 23/562; H01L 23/585
See application file for complete search history.

(56) References Cited

U.S. PATENT DOCUMENTS

| | | | |
|---|---|---|---|
| 9,960,098 B2 | 5/2018 | Olson | |
| 2013/0127037 A1* | 5/2013 | Mori | ............... H01L 23/3677 257/712 |
| 2014/0131860 A1* | 5/2014 | Kanda | ............... H01L 23/481 257/737 |
| 2015/0115416 A1* | 4/2015 | Costa | ............... H01L 23/3737 257/632 |
| 2016/0336214 A1* | 11/2016 | Petzold | ............ H01L 27/1203 |
| 2018/0174948 A1* | 6/2018 | Butt | ................. H01L 23/481 |

OTHER PUBLICATIONS

Jayamon, et al., "Multigate-Cell Stacked FET Design for Millimeter-Wave CMOS Power Amplifiers", IEEE Journal of Solid-State Circuits, vol. 51, No. 9, Sep. 2016, pp. 2027-2039 (13 pgs).

* cited by examiner

*Primary Examiner* — Mohammed Shamsuzzaman
*Assistant Examiner* — Aaron J Gray
(74) *Attorney, Agent, or Firm* — Jaquez Land Greenhaus LLP; Bruce W. Greenhaus, Esq.

(57) ABSTRACT

An integrated circuit architecture that provides a path having relatively low thermal resistance between one or more electronic devices and one or more thermal structures formed on an insulator layer on a substrate. Independent parallel thermal conduction paths are provided through the insulator layer, such as a buried oxide ("BOX") layer, to allow heat to flow from the substrate layer to a collector column having a portion in common with a thermal structure disposed upon the BOX layer. In some cases, the substrate is a silicon substrate layer supporting the thermal structure and the collector column and a heat source, such as an electronic device (e.g., power amplifier, transistor, diode, resistor, etc.).

30 Claims, 23 Drawing Sheets

S-CONTACT THERMAL STRUCTURE WITH ACTIVE CIRCUITRY

BACKGROUND

(1) Technical Field

Various embodiments described herein relate to fabrication of semiconductors. In particular, some embodiments relate to systems and methods for efficiently conducting heat away from a heat source disposed on a poor thermal conducting layer of a semiconductor integrated circuit.

(2) Background

Dissipating heat can be important for protecting electronic devices and achieving higher levels of performance in such devices. In particular, electronic devices, such as diodes, transistors, resistors, etc., manufactured on an insulating layer over a semiconductor substrate can overheat if heat is not dissipated efficiently. In one example, such components are provided in a silicon on insulator (SOI) device. The SOI device is made using a silicon substrate. For such devices, a thermal conduction path can be provided that enables heat to flow away from an electronic device. In general, the heat flows to a thermal structure placed close by on the semiconductor substrate. Such a thermal structure can conduct heat away from the device and toward a heat sink (for example, an ideal thermal sink). The heat can flow through the substrate to the heat sink, if the heat sink is either wirebonded to the substrate or attached in a similar manner, such that the attachment provides a thermal connection from the substrate to the heat sink. Dissipating the heat generated by components of an SOI becomes more difficult when the SOI integrated circuit chip ("IC") is mounted as a "flip-chip". In particular, the fact that SOI ICs have an insulating layer, which is needed to implement such SOI ICs make the problem of dissipating heat more difficult. Flip chip, also known as controlled collapse chip connection, is a method for interconnecting semiconductor devices (such as IC chips and microelectromechanical systems) to external circuitry with solder bumps that have been deposited onto the chip pads. The solder bumps are deposited on the chip pads on the top side of the wafer during the final wafer processing step. In order to mount the chip to external circuitry (e.g., a circuit board or another chip or wafer), it is flipped over so that its top side faces down. This aligns its pads with matching pads on the external circuit. The solder is then reflowed to complete the interconnect. Flip chip mounting is used rather than relying on wire bonding. With wire bonding, the chip is mounted upright and wires are used to interconnect the chip pads to external circuitry.

In flip-chips, the heat must flow from the source through a variety of paths (primarily the substrate) to a solder bump or copper pillar that connects the IC to a printed circuit board or heat sink. The heat then flows into the heat sink. Such thermal structures include structures commonly referred to as "thermal bumps" or "thermal pillars". However, the electrically insulating layer that is formed between an electronic device and a silicon substrate layer is typically also a thermally insulating layer (i.e., a poor thermal conductor). In some cases, the insulating layer is a buried oxide (BOX) layer. Accordingly, because the thermal conduction path between the device and the thermal structure typically has to traverse the BOX layer, the thermal resistance over the conduction path is higher than is desirable. Accordingly, the thermal efficiency of the conduction path for removing heat from the heat source is relatively low.

One way this problem has been addressed is by electrically connecting the device to metallic wires that are large enough to also provide a thermal conduction path. Thus, heat is conducted directly from the device through the electrical contacts to a thermal heat sink, such as a thermal sink. In some such cases, the same structure that provides an electrical ground for the device can serve as a thermal sink as well. However, this approach requires the electrical contacts to be relatively large and may not be ideal in all cases.

Alternatively, in some cases, a substrate contact ("S-contact") formed from material having a low thermal resistance is used to provide an electrical conduction path from the electronic device through the insulating layer (e.g., the BOX layer) to the substrate. The S-contact is essentially a thermal via through the BOX layer. However, the electrical conduction path provided by such S-contacts typically has an insufficient effect with regard to reducing the overall thermal resistance from the silicon substrate through the BOX layer to the thermal structure. This is because the physical size of the S-contact is relatively small and so even though the S-contact material has a relatively low thermal resistance, the size prevents it from providing a robust thermal conduction path through the BOX layer.

Therefore, there is a currently a need for a structure that provides a path having relatively low thermal resistance between an electronic device and a thermal structure, particularly by providing a more efficient thermal conduction path through the BOX layer.

SUMMARY OF THE INVENTION

The invention encompasses an integrated circuit (IC) architecture that provides a path having relatively low thermal resistance between one or more electronic devices and one or more thermal structures formed on an insulator layer on a substrate. A high density of independent parallel thermal conduction paths is provided through the insulator layer, such as a buried oxide ("BOX") layer, to allow heat to efficiently flow from the electronic devices through the substrate to one or more associated thermal structures. In some cases, the substrate is a silicon substrate supporting the thermal structure and a heat source. In some cases, the heat source is an electronic device. In some such cases, the electronic device is a power amplifier. Alternatively, the heat source can be a field effect transistor (FET), a diode, a resistor, or any other component or combination of components in which power is dissipated and/or in which heat is generated.

In some cases, the thermal structure includes several layers of material topped with a "thermal bump" or "thermal pillar" and solder cap. Multiple thermal conduction paths through the substrate to the thermal structure are provided by a plurality of substrate contacts ("S-contacts"), each formed from a material having a low thermal resistance. The number of S-contacts provided can be as great as is allowed by the design rules that dictate the manner in which structures can be formed at each layer of the IC.

In one case, each thermal pillar is formed as a structure having several layers. The S-contacts are formed between the thermal pillar and the substrate and provide a thermal conduction path through the intervening BOX layer. In at least one case, in excess of 1,000 S-contacts are disposed under a single thermal pillar. In at least one other case, in excess of 6,000 S-contacts are disposed under a single thermal pillar. In one case, each of the S-contacts is evenly spaced over the area underlying the thermal pillar. In at least one such case, at least one region under the thermal pillar is devoid of S-contacts. Having areas under the thermal pillar that are devoid of S-contacts ensures adherence to the design rules that dictate the fabrication of the structure (e.g., ensures the integrity of the structure).

In some embodiments, the thermal pillar is a hexagonal shaped structure that can take up considerable real estate on the semiconductor. Therefore, in some embodiments, in order to provide flexibility in the location of the real estate on which active components can be formed, S-contacts are restricted to a portion of the hexagonal area over which the thermal pillar is formed. Restricting the area over which the S-contacts can be formed reduces the efficiency of the thermal conduction path from the heat sources to the thermal pillar. In some embodiments, the reduction in the area on which S-contact are formed under the thermal structure is offset by forming S-contacts outside the area of the thermal structure. For example, in some embodiments, S-contacts are formed along one or more collector columns formed in essentially rectangular areas of the semiconductor. In alternative embodiments, the shape of the collector columns may vary (i.e., may be other than generally rectangular). A heat conducting layer is formed in conformance with the shape of the collector columns to provide a thermal conduction path for heat to flow from the S-contacts to one or more thermal pillars on the semiconductor. In some cases, in addition to the conduction path through the S-contacts, some heat is also conducted through the metal layers of the semiconductor.

In some embodiments, the semiconductor is used as a component of a radio frequency (RF) device, such as a cellular telephone. For example, the heat source may be a low noise amplifier (LNA) or the field effect transistors of an LNA.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION

An integrated circuit (IC) architecture is disclosed that provides a path having relatively low thermal resistance between one or more heat sources (e.g., electronic devices) and one or more thermal structures (e.g., thermal pillars) formed on an insulator layer. The insulator layer is disposed on a substrate. A high density of independent parallel thermal conduction paths (i.e., substrate contacts or "S-contacts") is provided through the insulator layer (e.g., a buried oxide layer), to allow heat to flow from the heat source through the substrate to one or more associated thermal structures. In some cases, the substrate is a silicon substrate supporting the thermal structure and a heat source.

Figure 1:
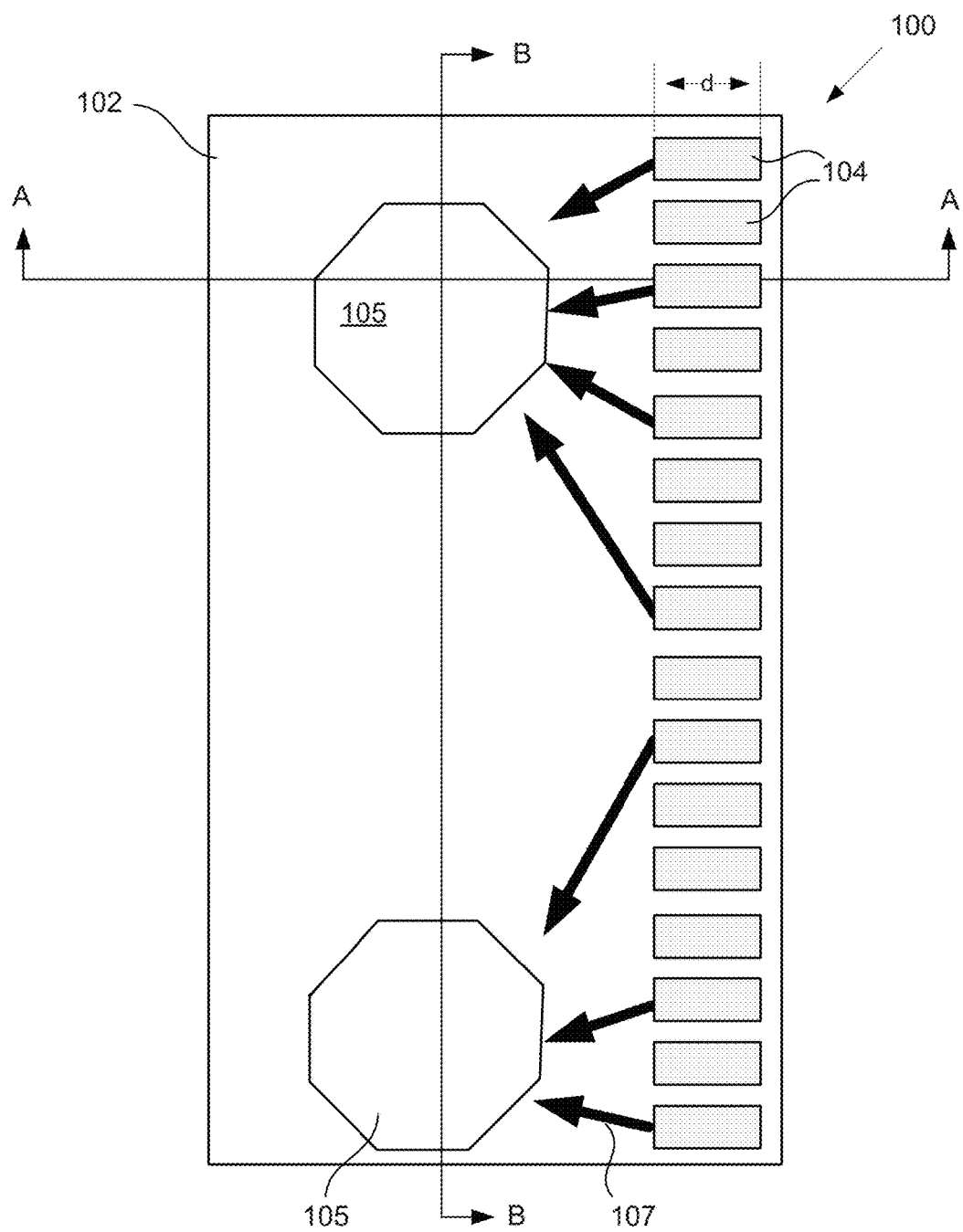
FIG. 1 is a top view of an example semiconductor device having two thermal pillars and S-contacts that are formed in areas that generally conform to the shape of each thermal pillar.

FIG. 1 is an illustration of one embodiment of a semiconductor device 100. The semiconductor device 100 is similar to the semiconductor device described in U.S. patent application Ser. No. 15/194,114 filed on Jun. 27, 2016, which application is hereby incorporated by reference. Sixteen heat sources 104 are shown within the device 100. It should be understood that the particular arrangement and quantity of the heat sources 104 shown in FIG. 1 merely provides one concrete example of an embodiment. In some such cases, each heat source 104 is an amplifier or other active semiconductor component that generates heat during operation. In other embodiments, the heat source is any electronic device that generates unwanted heat. Since the particular architecture of the heat source 104 is not related to the concepts disclosed herein, no additional details regarding the heat source 104 are provided. However, those of ordinary skill in the art will understand the structure of such heat sources. In addition to the heat sources, the device 100 has two thermal pillars 105. Arrows 107 in the figure indicate the flow of heat from the heat sources 104 to the thermal pillar 105. In some embodiments, the distance between the thermal pillar 105 and the heat source is at least as long as twice the distance "d" across the largest dimension of the heat source 104.

Figure 2:
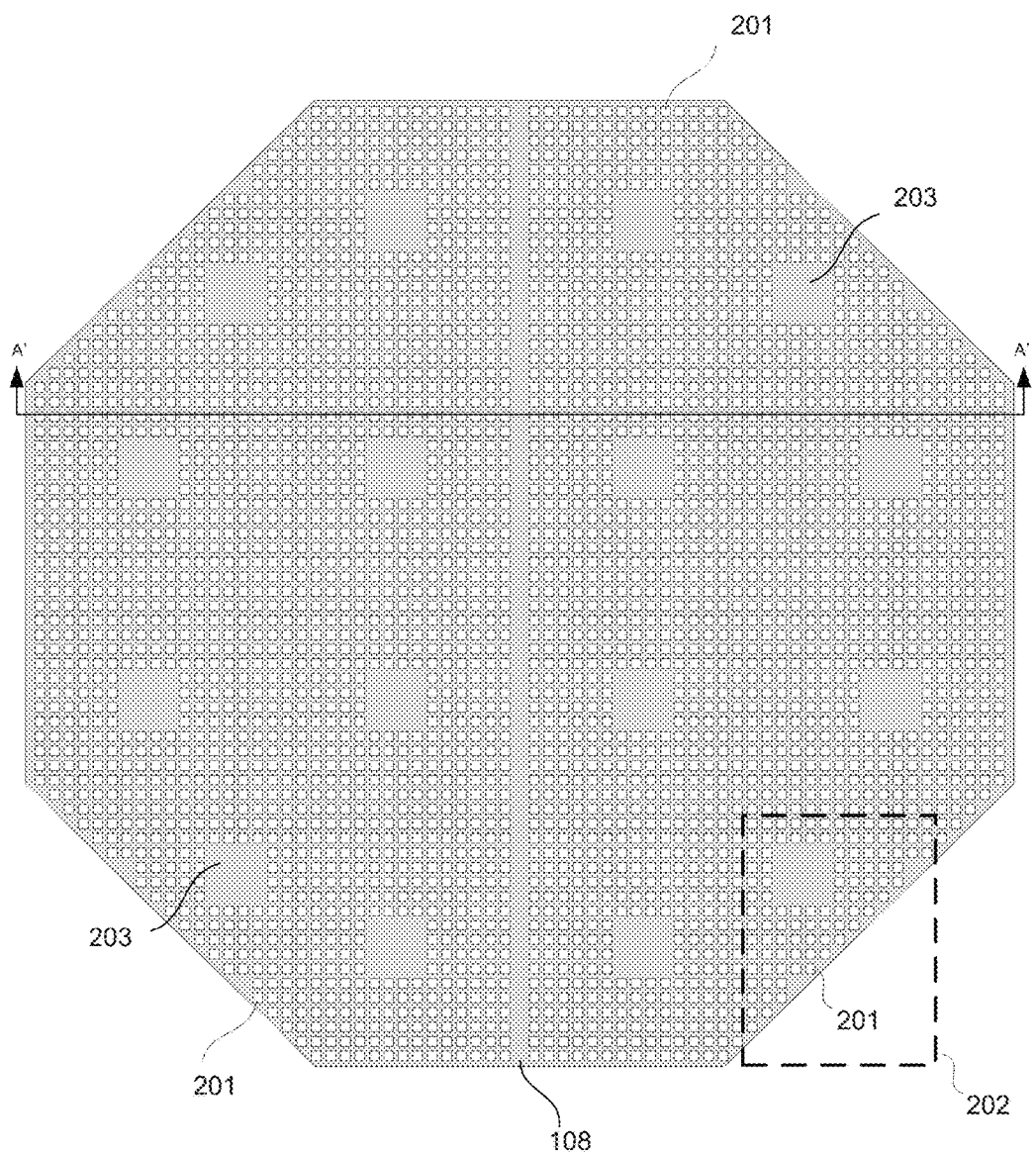
FIG. 2 is transverse cross-sectional view of the layers of a semiconductor that form the thermal pillar and underlying S-contacts in accordance with some embodiments of the disclosed method and apparatus.

FIG. 2 is an illustration of one thermal pillar 105 and a plurality of associated S-contacts 201 under the thermal pillar 105. Each of the smaller rectangles shown in FIG. 2 is an S-contact 201. In this particular example, there are 66 S-contacts 201 lying along the line A'-A' under the widest part of the thermal pillar 105. It should be noted that the line A-A in FIG. 1 traverses a longer path along the device 100 than the line A'-A' of FIG. 2. However, the line A'-A' of FIG. 2 is a portion of the line A-A of FIG. 1. In the embodiment shown, a total of 6,244 S-contacts 201 are formed within a polygon that is sized to essentially match the "footprint" of the thermal pillar 105 (only 3 S-contacts 201 are referenced to avoid clutter in the figure). The S-contacts 201 provide a thermal connection from a substrate that lies beneath the thermal pillar 105, through an insulating layer 106 (see FIG. 3 and associated discussion) and to the thermal pillar 105 itself, as will be discussed in more detail below. In some embodiments, such as the embodiment shown in FIG. 2, there are a number of "void areas" 203 distributed throughout the area occupied by the thermal pillar 105. No S-contacts 201 are present in these voids 203. In such embodiments, the void areas 203 allow the structure to adhere to the design rules that determine the maximum number of S-contacts 201 that should/can be used.

Figure 3:
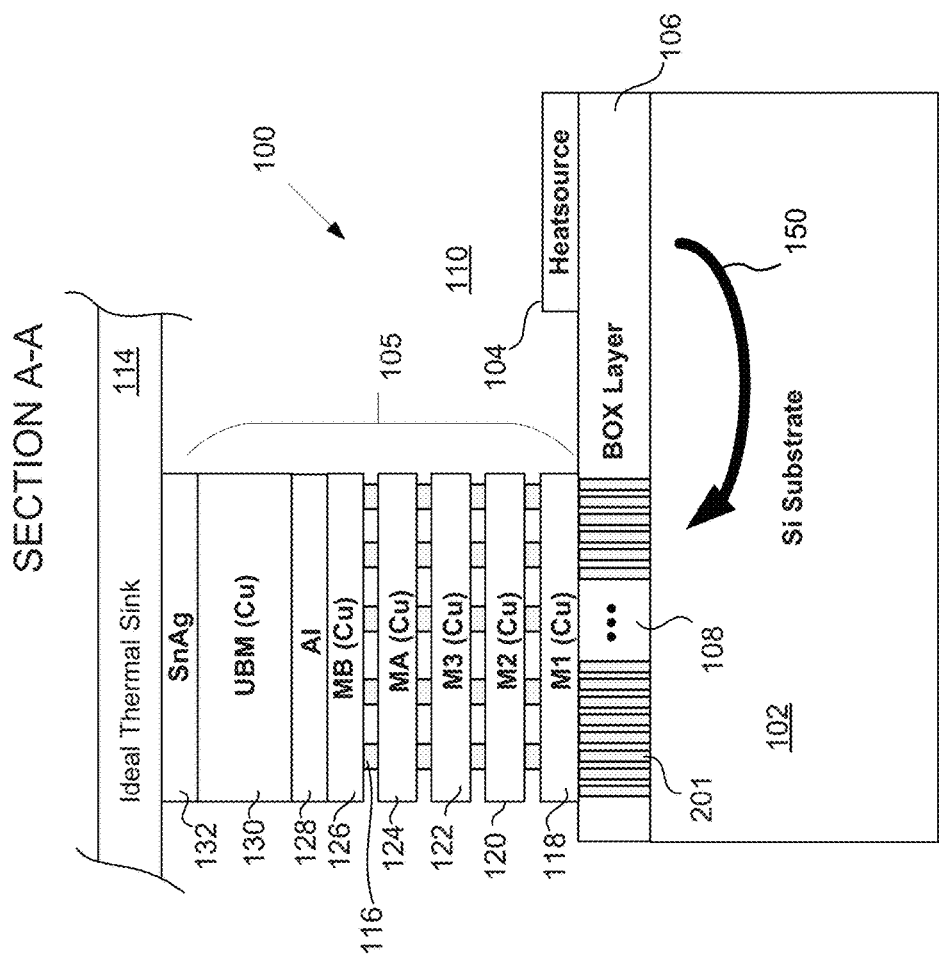
FIG. 3 is longitudinal cross-sectional view of the layers of a semiconductor that form the thermal pillar and underlying S-contacts in accordance with some embodiments of the disclosed method and apparatus.

FIG. 3 is a cross-sectional view of the device 100 taken along the line A-A and showing the layers of the device 100. FIG. 3 is not to scale. That is, there are several S-contacts 201 shown in FIG. 3, but clearly the S-contact 201 in FIG. 3 are drawn larger than in actuality (i.e., than as shown in FIG. 2). The semiconductor device 100 includes a substrate 102. The substrate 102 provides an electrical and structural base upon which components of the semiconductor device 100, such as the heat sources 104 and thermal pillars 105, are built. In one example, the substrate 102 is $Al_2O_3$. Alternatively, the substrate 102 may be silicon. In one example, the $Al_2O_3$ is 200 um thick and has a thermal conductivity of approximately 42 Watt per meter Kelvin (W/m-K). If the substrate is composed of silicon of the same thickness, the substrate 102 will typically have a thermal conductivity of 148 K W/m-K. It should be noted that any material (of any thickness and thermal conductivity) can be used to fabricate the substrate 102, assuming that the resulting substrate has properties desired for fabricating the heat source 104. In the illustration of FIG. 3, the heat source 104 is shown without detail. That is, the heat source 104 may comprise several layers of material that are not shown in FIG. 3. The heat source 104 is shown without detail for the sake of simplicity and since the details of the heat source 104 are outside the scope of this disclosure.

The heat source 104 is mounted on an insulator layer 106 that resides between the heat source 104 and the substrate 102. In one case, the insulator layer 106 is a buried silicon oxide ($SiO_2$) layer (commonly referred to as a "BOX layer"). For the purposes of this discussion, the insulator layer 106 beneath the heat source 104 is referred to as a "heat BOX layer", while the portion of the insulator layer 108 under the thermal pillar 105 is referred to as the "sink BOX layer". It will be understood that the heat insulator layer 106 can be formed from any material having properties desirable for fabricating the heat source 104. One of the properties of the insulator layer 106 is that it electrically insulates the heat source 104 from the substrate 102.

In the illustrated example, the sink BOX layer 108 and the heat BOX layer 106 are formed together and run into one another. In some cases, the sink BOX layer 108 is fabricated from the same material as the heat BOX layer 106 (e.g., $SiO_2$) formed at the same time (i.e., as one "layer"). However, a void can be formed between them by etching or otherwise removing the material that would otherwise occupy the void. In some embodiments, the two sections 106, 108 of the insulator layer may be formed at separate times and with different materials. In some cases, the heat BOX layer 106 and the sink BOX layer 108 are each about 1 um thick; in other cases, the heat BOX layer 106 and the sink BOX layer 108 are about 0.05 um thick. However, those skilled in the art will recognize that in other cases, the BOX layers 106, 108 may be either thicker or thinner than noted above. In the illustrated example, the thermal conductivity of each BOX layer 106, 108 is 1.38 W/m-K.

A thermal structure, commonly referred to as a thermal pillar 105 is fabricated on top of the sink BOX layer 108. In some embodiments, the thermal pillar 105 includes a metal layer 130 and a solder cap 132 over the thermal pillar 105. In some embodiments, the metal layer 130 is formed of copper. In some cases, the thermal pillar 105 further includes several layers that are compatible with the overall manufacturing process for the IC. For example, in some embodiments, the thermal pillar 105 includes multiple thermally conductive layers 118, 120, 122, 124, 126, 128. In the illustrated example, a seven-layer thermal pillar 105 is formed on top of the sink BOX layer 108 as follows: a first layer M1 of copper (Cu) 118; a second layer M2 of copper 120; a third layer M3 of copper 122; a fourth layer MA of copper 124; a fifth layer MB of copper 126; a sixth layer 128 of aluminum (Al); and a thick seventh layer UBM of copper (Cu) 130. The first six layers are formed as part of the fabrication of a larger structure that includes the structures that are shown in FIG. 3 and other structures that are not shown. For example, each copper layer 118, 120, 122, 124, 126, 128 may be used to form conductors (i.e., wired connections) between other components that are formed on the substrate 102 at other parts of the integrated circuit not shown in FIG. 3. In one such embodiment, "vias" 116 are formed between the different copper and aluminum layers 118, 120, 122, 124, 126, 128. In some embodiments, tungsten is used for the vias 116. The tungsten is etched away from any areas where it is not used as a via between the conductive layers 118, 120, 122, 124, 126, 128. Once the tungsten has been etched away, an insulating material (not expressly shown) is typically placed in the spaces between the vias to provide both insulation between metal layers and also to provide structural support. As shown in FIG. 3, the first layer 118 through the sixth layer 128 has been removed (e.g., etched or otherwise) from everywhere but over the sink BOX layer 108. Insulating material may be used to fill the areas that are left open when any of the layers are removed. The array of S-contacts 201 provides an improved heat flow path through the sink BOX layer 108.

A solder cap 132 (such as a silver/tin alloy) may be formed over the top of the thermal pillar 105 for thermally and electrically connecting the thermal pillar 105 to an ideal thermal sink 114. It should be appreciated that the composition of the thermal pillar 105 is only an example.

As noted above, the heat source 104 generates excess heat that may need to be dissipated. The thermal pillar 105 provides one leg of a thermal conduction path for heat generated by the heat source 104 to flow to the ideal thermal sink 114. The other legs of the thermal conduction path are formed by the heat BOX layer 106, the substrate 102, and the sink BOX layer 108. Arrow 150 indicates the flow of heat from the heat source 104 through the heat BOX layer 106, the substrate 102, and the sink BOX layer 108 to the thermal pillar 105, and thus ultimately to the "ideal thermal sink" 114.

Figure 4:
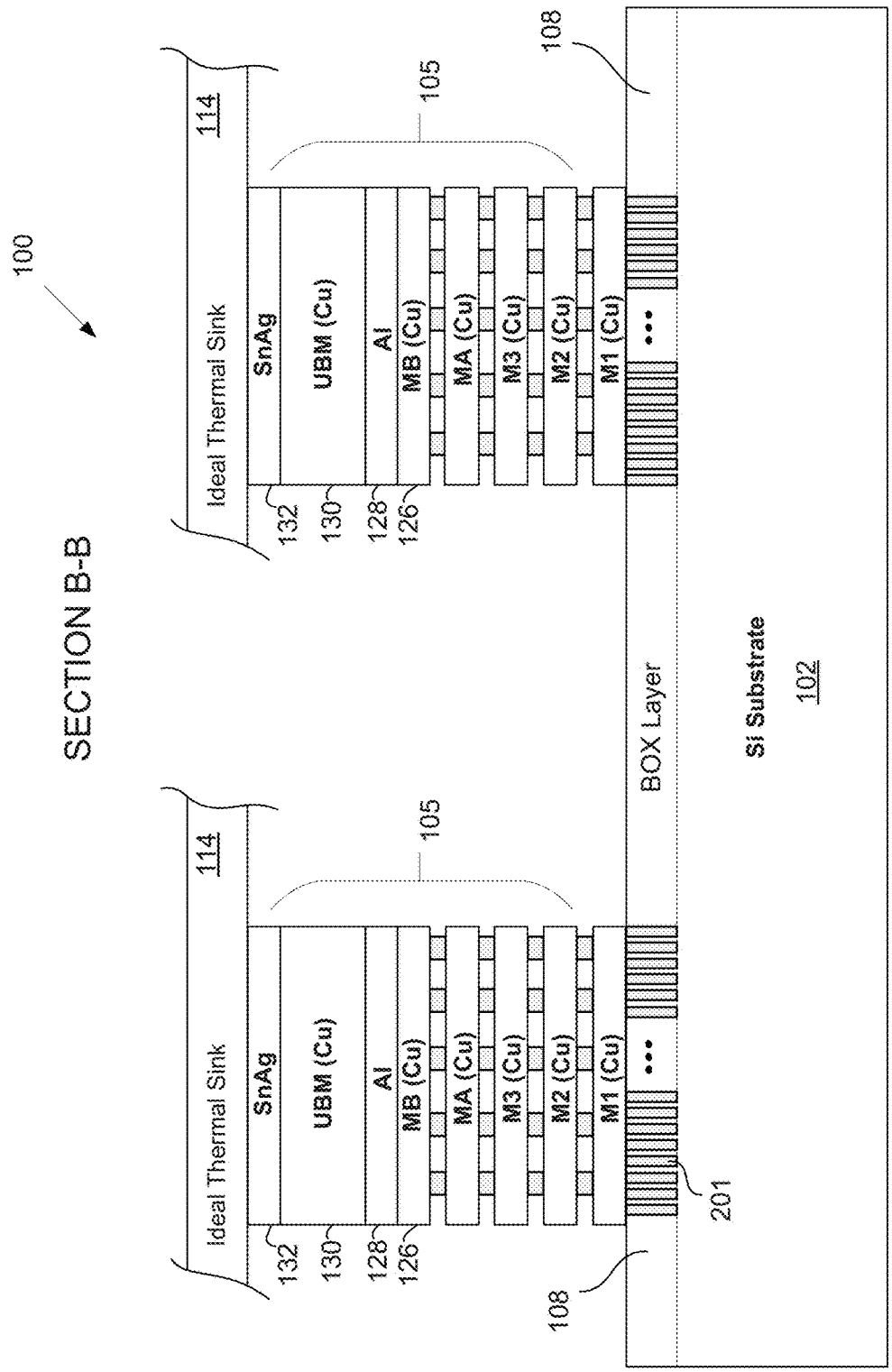
FIG. 4 is a top view of an example semiconductor device having two thermal pillars and S-contacts that are formed under a collector column that coincides with a portion of the area occupied by each thermal pillar in accordance with some embodiments of the disclosed method and apparatus.

FIG. 4 is a cross-sectional view along line B-B. For the sake of simplicity, circuitry that might be present between the two thermal pillars 105 shown in FIG. 1 is not shown in FIG. 4. However, those skilled in the art will recognize that such circuitry may be present where allowed by the design rules being used for the particular fabrication process being implemented to fabricate the semiconductor device 100.

Figure 5:
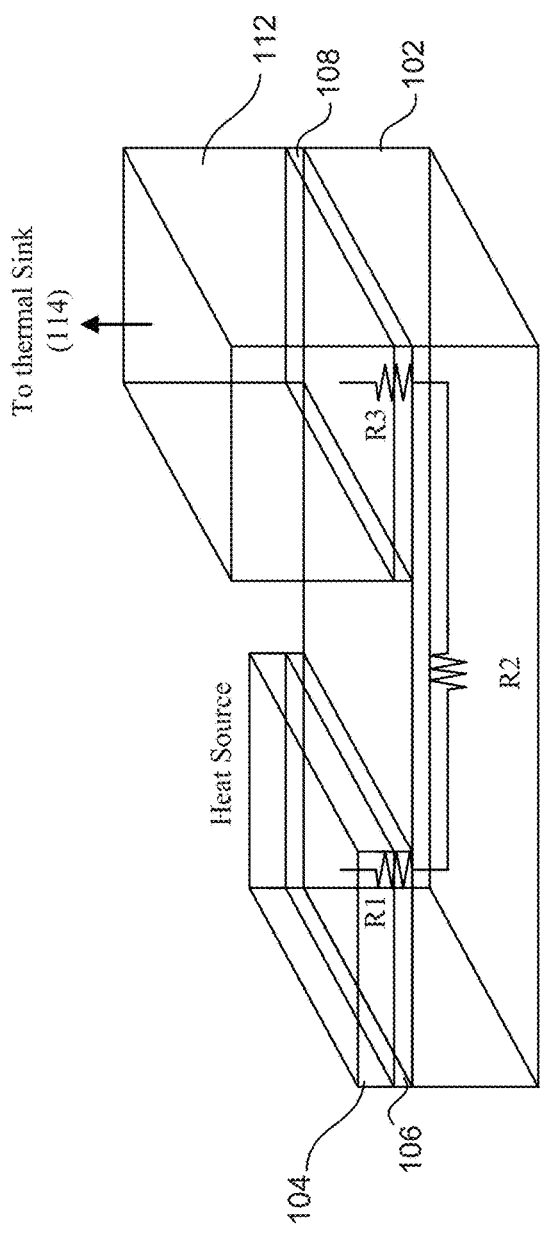
FIG. 5 is a simplified thermal schematic of the components within a thermal conduction path from a heat source to an ideal thermal sink in an embodiment with components shown in perspective view.

FIG. 5 is a simplified thermal schematic of the components within a thermal conduction path from a heat source 104 to an ideal thermal sink 114 in an embodiment with components shown in perspective view. There are no S-contacts through the sink BOX layer 108 along the thermal path shown in FIG. 5. Therefore, the thermal resistances R1 and R3 are relatively high.

Figure 6:
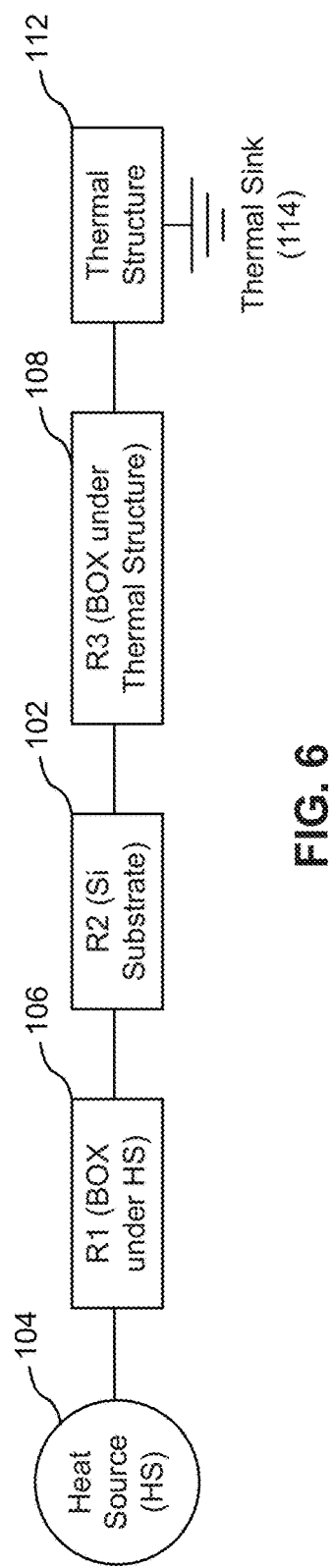
FIG. 6 is a block diagram representing the thermal conduction path from a heat source to an ideal thermal sink for the embodiment of FIG. 5.

FIG. 6 is a block diagram representing the thermal conduction path from a heat source 104 to an ideal thermal sink 114 for the embodiment of FIG. 5. The thermal resistance of the heat BOX layer 106 is designated as R1, the thermal resistance of the substrate 102 is designated as R2, and the thermal resistance of the sink BOX layer 108 is designated as R3. Because the material used in fabricating the heat BOX layer 106 and the sink BOX layer 108 are selected to be electrical insulators, those layers typically are not good heat conductors. More particularly, the thermal conductivity of the BOX layers 106, 108 is one to two orders of magnitude less than the thermal conductivity of the substrate 102 and generally more than two orders of magnitude less than the thermal conductivity of the layers of the thermal pillar 105. Accordingly, the sum $R_{tot}$ of these three thermal resistances (R1+R2+R3) is typically substantial, especially R1 and R3.

To reduce the total resistance $R_{tot}$, in various disclosed embodiments of the semiconductor device, a high density of thermally conductive S-contacts 201 are formed through the sink BOX layer 108 to essentially bypass the thermal resistance R3 of the sink BOX layer 108. Doing so provides a set of parallel heat conduction paths that lower the total thermal resistance to the flow of heat from the heat source 104 to the thermal pillar 105.

Figure 7:
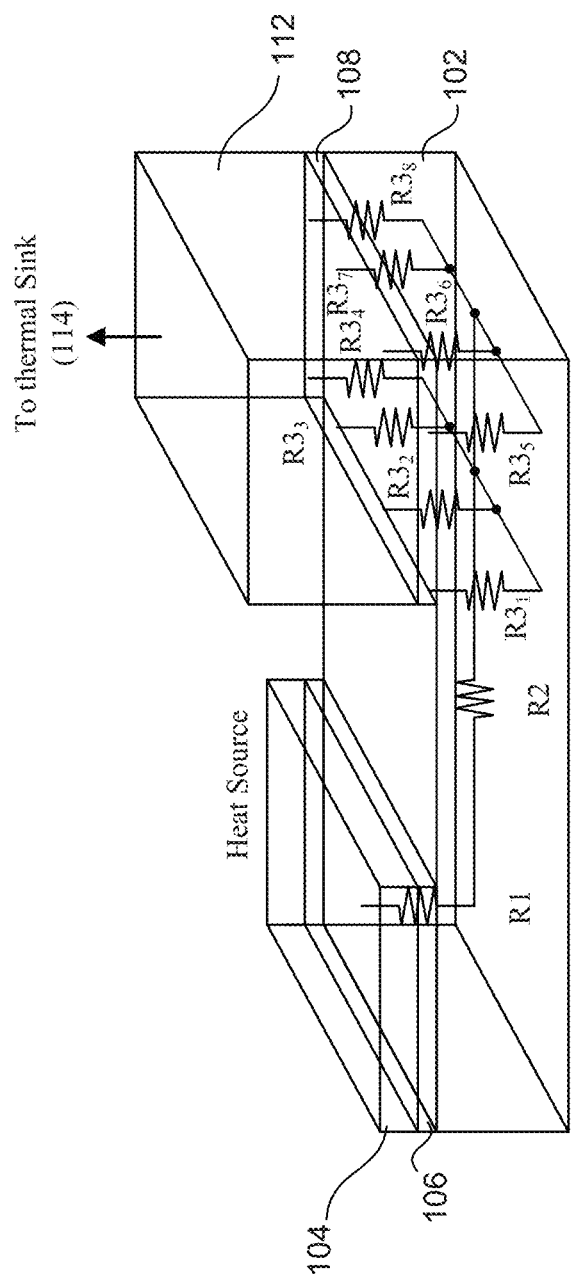
FIG. 7 is a simplified thermal schematic of the components within a thermal conduction path from a heat source to an ideal thermal sink through a plurality of thermally conductive S-contacts with components shown in perspective view.
Figure 8:
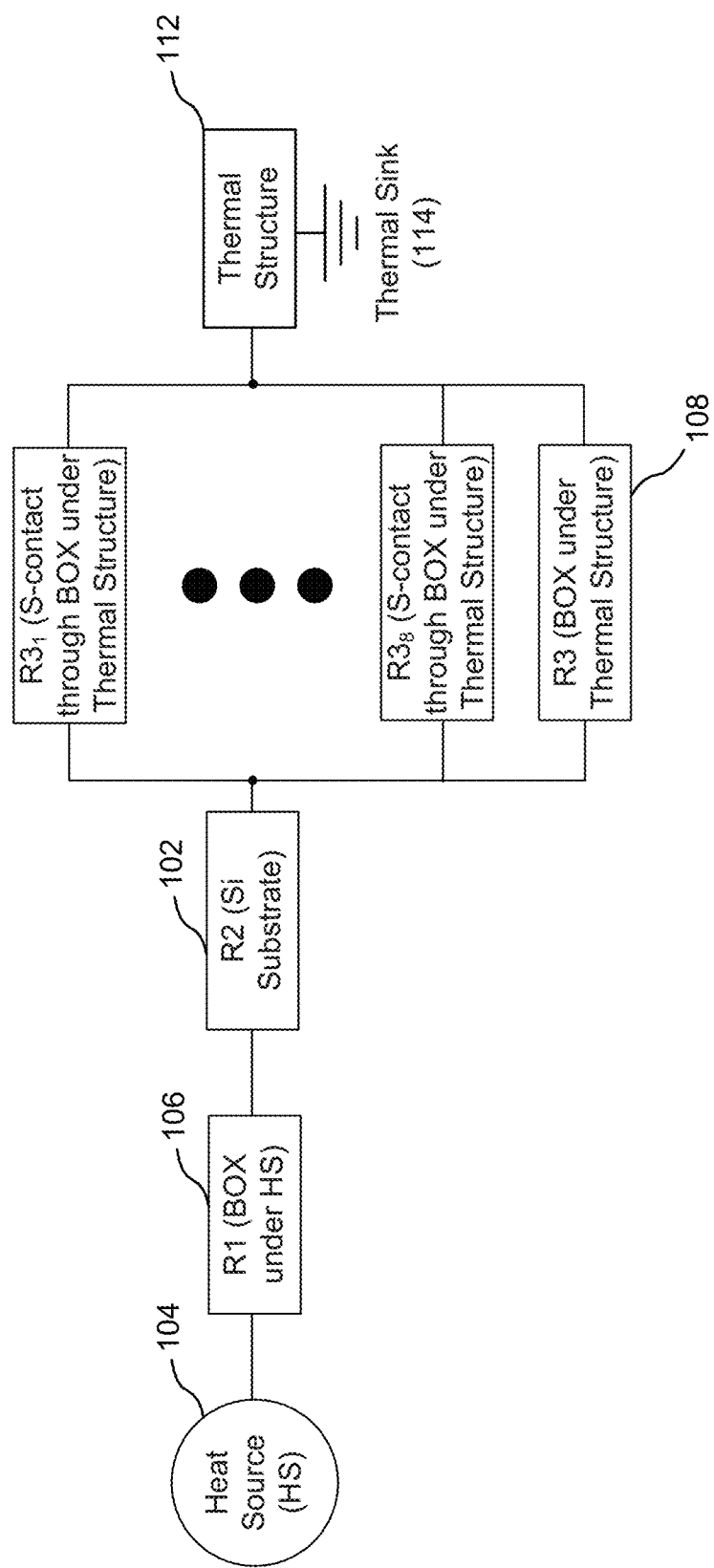
FIG. 8 is a block diagram representing the thermal conduction path from a heat source to an ideal thermal sink through a plurality of thermally conductive S-contacts.

FIG. 7 is a simplified perspective view of the components within a thermal conduction path from a heat source to an ideal thermal sink through a plurality of thermally conductive S-contacts 201. FIG. 8 is a block diagram representing the thermal conduction path from a heat source to an ideal thermal sink through a plurality of thermally conductive S-contacts 201. In both FIG. 7 and FIG. 8, 8 S-contacts $R3_1$ through $R3_8$ are shown by way of example. By placing each of the 8 S-contacts 201 in series between the substrate 102 and the sink BOX layer 108, the total thermal resistance is reduced. Thus, $R_{tot}$=R1+R2+R3', where R3'=[1/((1/R3$_1$)+(1/R3$_2$)+(1/R3$_3$)+(1/R3$_4$)+(1/R3$_5$)+(1/R3$_6$)+(1/R3$_7$)+(1/R3$_8$)+(1/R3))]. Preferably, each of the values for $R3_i$ is relatively low. Therefore, the sum of the parallel thermal resistances of the S-contacts 201 is therefore less than the thermal resistance R3 through the sink BOX layer 108 alone.

In the illustrated example of FIG. 7 and FIG. 8, only eight S-contacts 201 are shown for ease of illustration. In many cases, the number of S-contacts 201 will be much larger. For example, in some cases, the number of S-contacts is 50, 100, 500, 1000, 5000 or more. The size and number (and hence density) of the S-contacts are process dependent (i.e., depend upon the particular fabrication process), but preferably the S-contacts 201 are provided in large numbers up to the maximum density allowed by the design rules associated with the particular fabrication process that dictate the manner in which such structures can be formed for that particular IC fabrication process. Thus, in the general case of n S-contacts 201, the total thermal resistance $R_{tot}$ is:

$$Rtot = R1 + R2 + \left[ 1 / \left( \left( \frac{1}{R3} \right) + \sum_{k=1}^{n} \left( \frac{1}{R3k} \right) \right) \right] \quad \text{Equation 1}$$

In the embodiment of FIGS. 1-4, the pattern of S-contacts 201 shown is octagonal to match the shape of a particular thermal pillar 105. However, other shapes for the thermal pillar 105 are possible, and thus the pattern of S-contacts 201 may vary. In addition, in some cases, the shape of the thermal pillar 105 and the shape defined by the distribution of S-contacts 201 within the sink BOX layer 108 are not the same. Also, the shape of the sink BOX layer 108 need not match either the shape of the base of the thermal pillar 105 or the shape defined by the distribution of S-contacts 201. While putting the S-contacts 201 directly under the thermal structure results in the shortest thermal path, the S-contacts 201 could be offset. In this case, the metal connection between the S-contacts 201 and the thermal structure would conduct heat between these points, although with increased thermal resistance. Nonetheless, in at least some cases, the S-contacts 201 generally underlie the entire thermal pillar 105, such that each of the S-contacts 201 makes contact with both the base layer (e.g., silicon epitaxy layer 116) of the thermal pillar 105 at a first end and with the substrate 102 at a second end. Further, it is desirable that the S-contacts 201 have a density such that at least approximately 15% of the base area of thermal pillar 105 is thermally coupled through to the substrate 102, and/or that the total thermal resistance $R_{tot}$ when using S-contacts 201 is within 150% of R1+R2 (i.e., as the bracketed component, R3', of $R_{tot}$ in Equation 1 approaches zero), and/or that the bracketed component, R3', of $R_{tot}$ in Equation 1 is less than about 1/(26.1 Watts per meter Kelvin).

Figure 9:
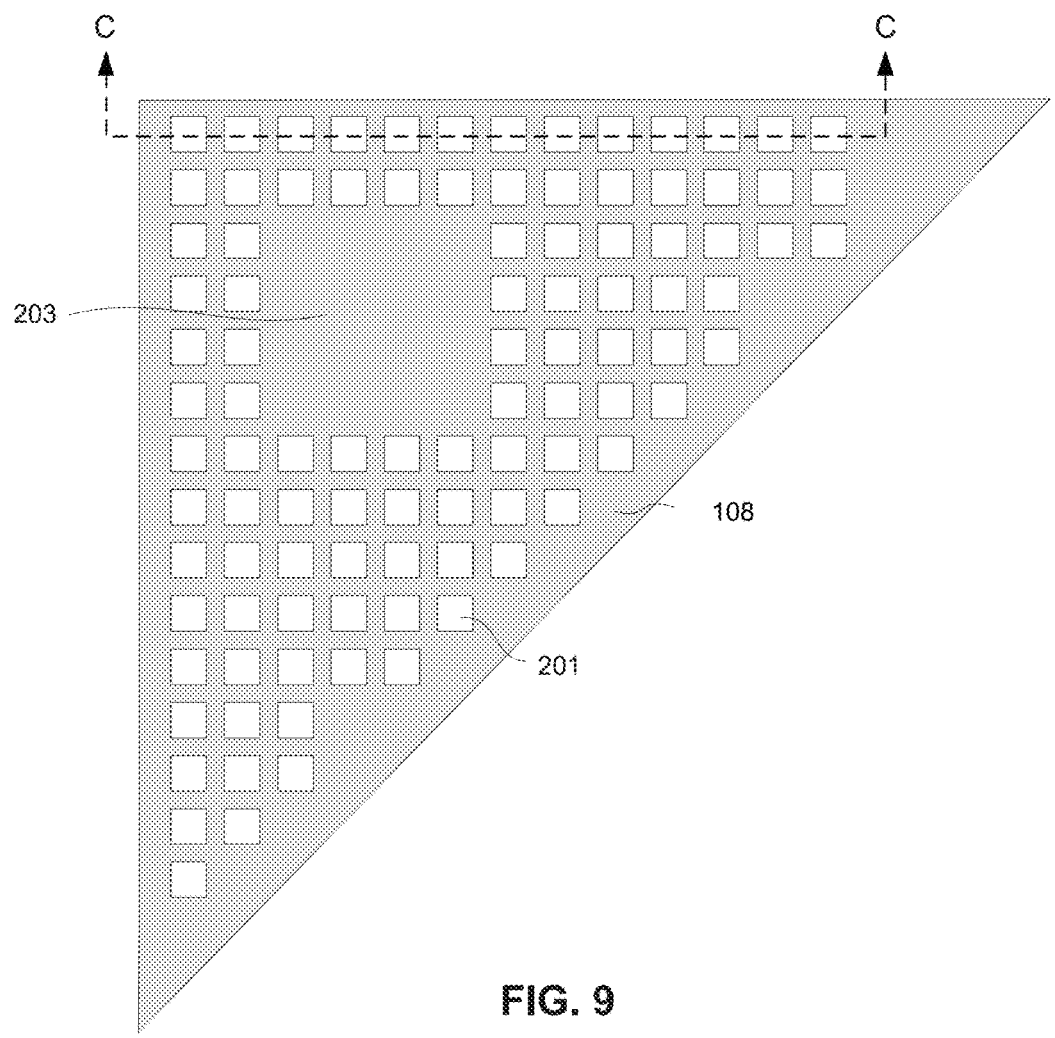
FIG. 9 is a magnified view of some of the S-contacts shown in FIG. 2.
Figure 10:
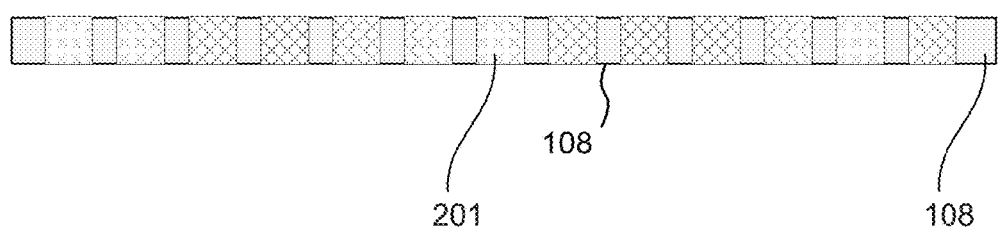
FIG. 10 is a cross-sectional view along the line C-C shown in FIG. 9.

FIG. 9 is a magnified view of some of the S-contacts 201 shown in FIG. 2 (i.e., those bounded by dashed box 202). Each of the S-contacts 201 is spaced apart from the adjacent S-contacts 201. FIG. 10 is a cross-sectional view along the line C-C shown in FIG. 9. Each of the S-contacts 201 penetrates through the sink BOX layer 108 in parallel to each of the other S-contacts 201. In some cases, the S-contacts 201 are made of tungsten. However, they can be made of other materials, such as polysilicon, copper, aluminum or other such thermally conductive materials. In addition, in one embodiment, they are made from layers of such materials. It should be noted that the S-contacts 201 need not be of the particular shape shown. Rather, they can be of any shape that provides an efficient grouping of the S-contacts 201. For example, the S-contacts 201 may be circular or polygonal in cross-section.

Figure 11:
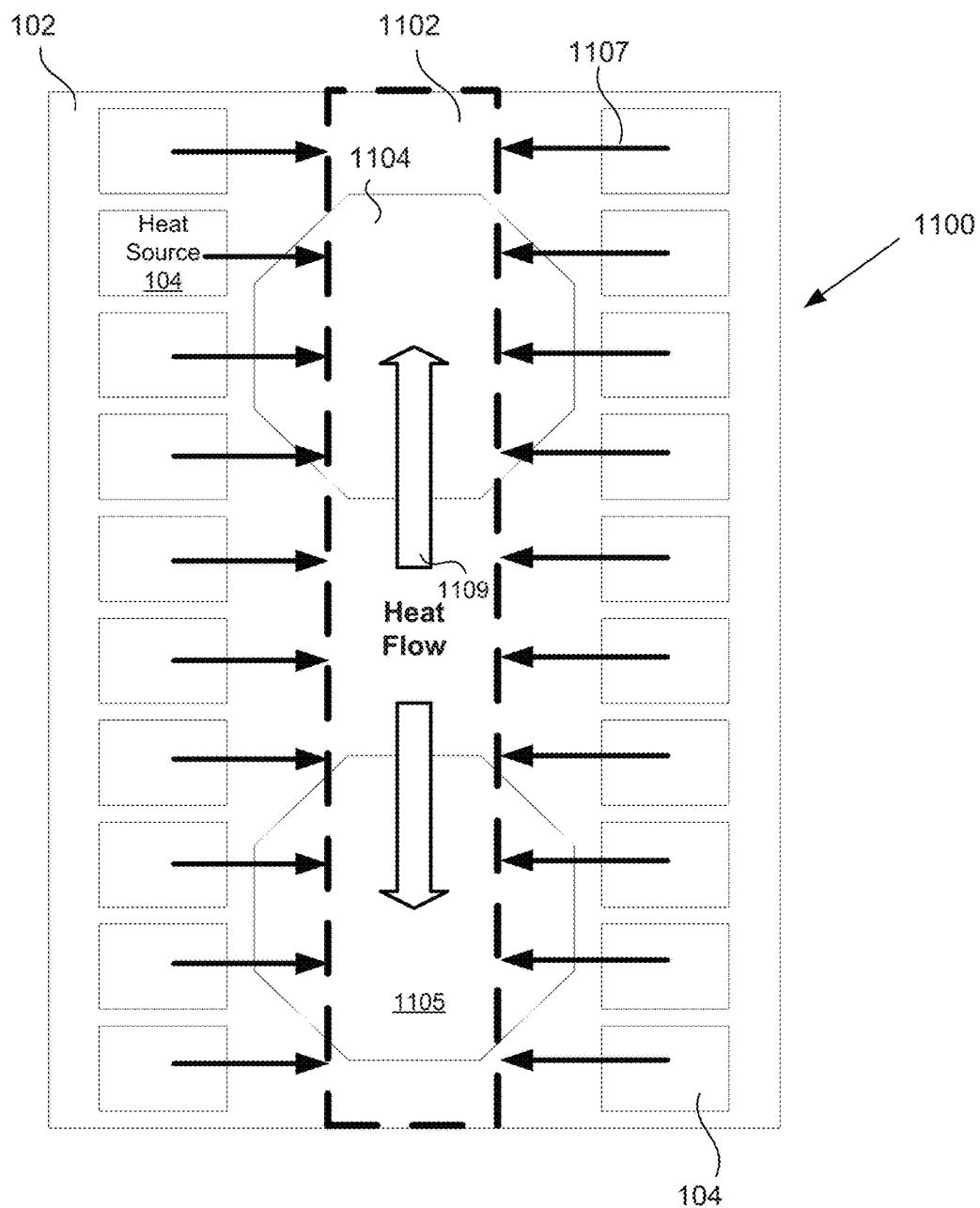
FIG. 11 is an illustration of a semiconductor device having a rectangular collector column and a plurality of thermal structures.

FIG. 11 is an illustration of a semiconductor device 1100 having a rectangular collector column 1102 and a plurality of thermal structures 1104, 1105. In some embodiments, the collector column 1102 comprises several layers, similar to the lower layers 118, 120, 122, 124 of the thermal pillar 105 discussed with regard to the semiconductor device 100 of FIGS. 1-4. In some embodiments, the upper layers 1326, 1328, 1330, 1332 (see FIG. 13A) are similar to the layers 126, 128, 130, 132 shown in FIG. 4) of the thermal structures 1104, 1105 and have a hexagonal shape, similar to the thermal pillar 105 shown in FIGS. 1-4. However, the lower layers (similar to layers 118, 120, 122, 124 in FIG. 4) are only present in the thermal structures 1104, 1105 in the areas 1201, 1202 (see FIG. 12) that are common to both the collector column 1102 and the thermal structures 1104, 1105. That is, the lower layers 1318, 1320, 1322, 1324 are not present in those areas under the thermal structure 1104, 1105 that lie outside the collector column 1102. In the device 1100, a plurality of heat sources 104 are disposed outside the footprint of the thermal structures 1104, 1105.

Figure 12:
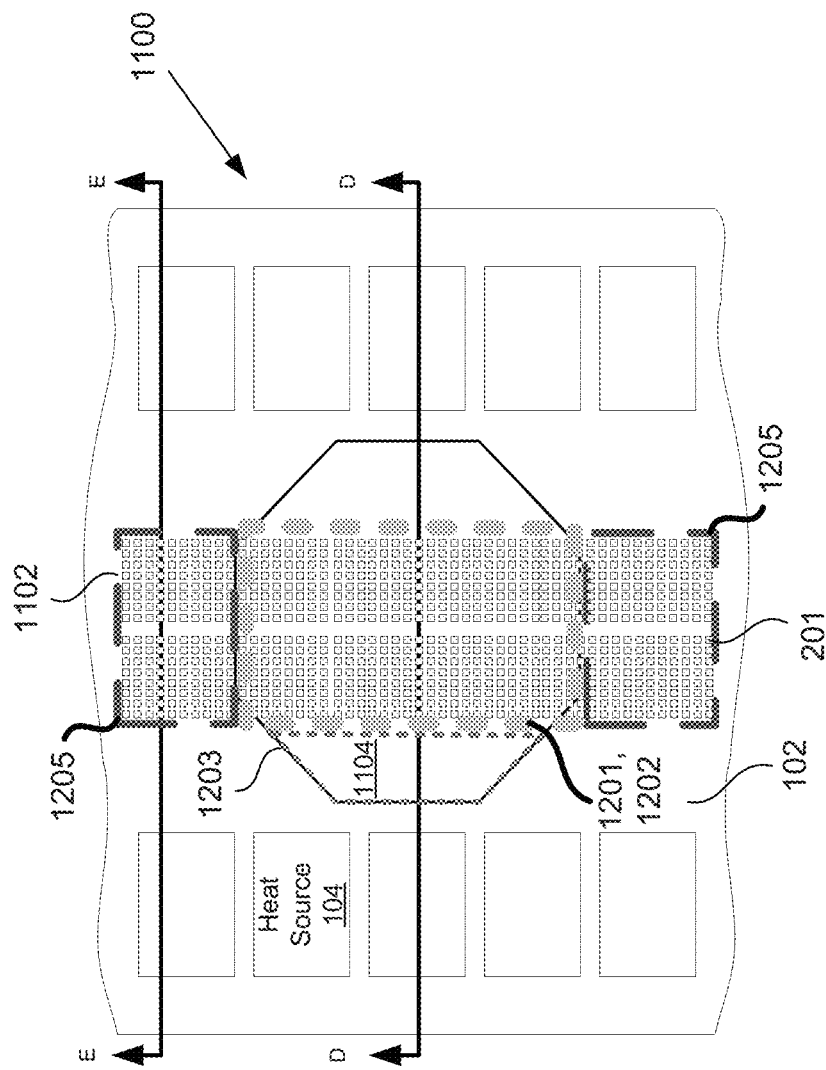
FIG. 12 is a more detailed illustration of one of the thermal structures and a portion of a collector column.

FIG. 12 is a more detailed illustration of a section of the device 1100 having one of the thermal structures 1104 and a section of the collector column 1102 and showing the S-contacts 201 that lie under the collector column 1102. The thermal structure 1104 comprises a first portion 1201 (enclosed by a dashed rectangle) and a second portion 1203 (enclosed by a dashed isosceles trapezoid). The collector column 1102 also comprises a first portion 1202. Viewed from the perspective shown in FIG. 12, the first portion 1201 of the thermal structure 1104 is coincident with the first portion 1202 of the collector column. However, as will be described in more detail below with regard to FIG. 13A, the first portion 1202 of the collector column 1102 comprises only some of the layers 1318, 1320, 1322, 1324 and make up a part of the first portion 1201 of the thermal structure 1100. Additionally, the collector column 1102 has second portions 1205 (two such second portions 1205 are shown in FIG. 12, each enclosed by a dashed rectangle) that lie outside the area occupied by the thermal structure 1104.

Figure 13A:
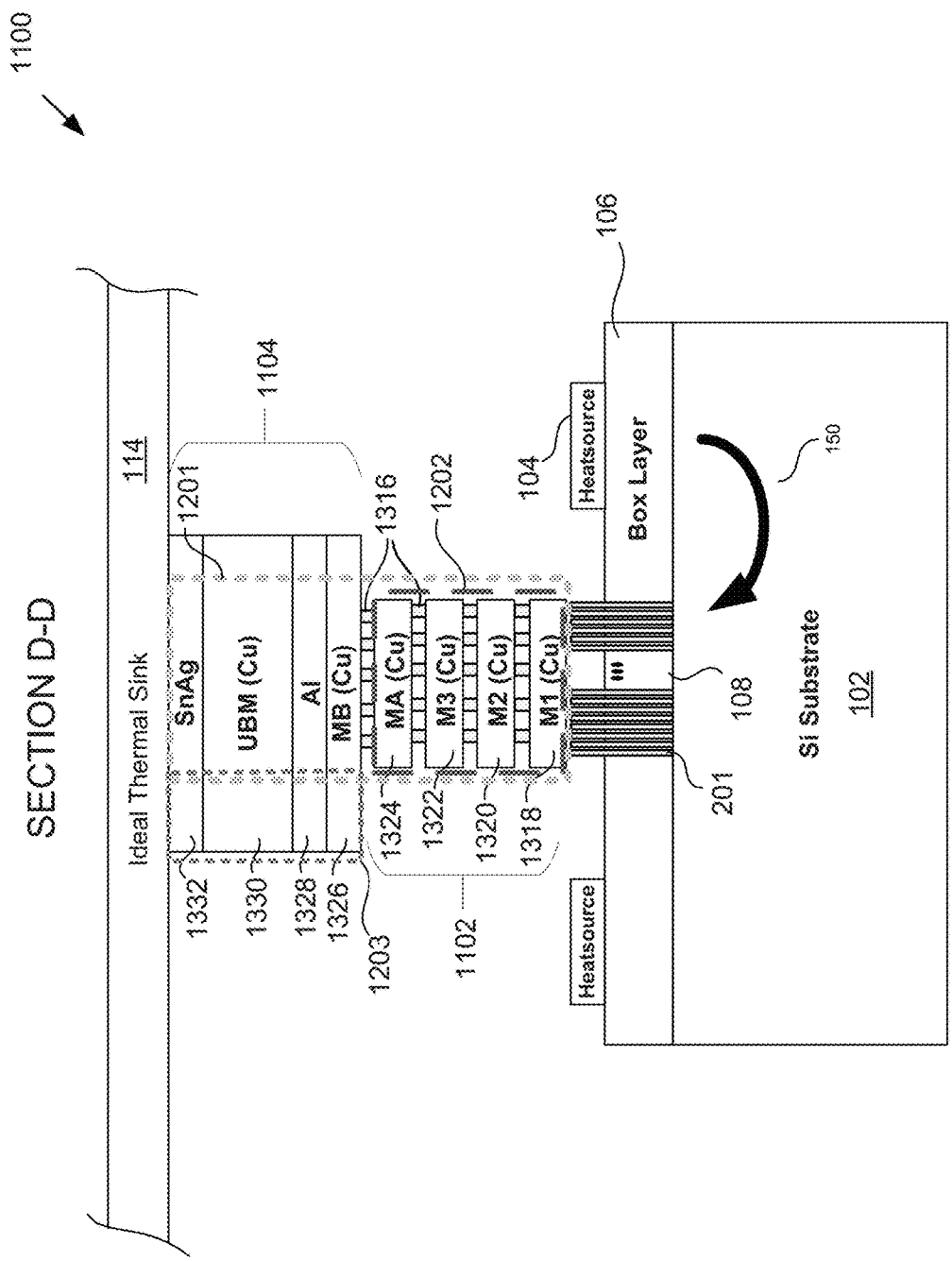
FIG. 13A is an illustration of the layers along a cross-section D-D of the device shown in FIG. 12.

FIG. 13A is an illustration of the layers 102, 106, 1318, 1320, 1322, 1324, 1326, 1328, 1330, 1332, 114 along a cross-section D-D of the device shown in FIG. 12. The first portion 1201 of the thermal structure 1104 comprises bottom layers 1318, 1320, 1322, 1324 and vias 1316 between each of the bottom layers, as well as a portion of the top layers 1326, 1328, 130, 1332. The second portion 1203 of the thermal structure 1104 comprise only that portion of the top layers 1326, 1328, 1330, 1332 that is not over the collector column 1102. The first portion 1202 of the collector column 1102 is included within the first portion 1201 of the thermal structure 1104. The second portion 1205 of the collector column 1102 is that portion of the collector column 1102 that extends beyond the perimeter of the thermal structure 1104. The second portion 1205 of the collector column 1102 extends outward from the page in FIG. 13A and is not distinguishable from the first portion 1202 of the collector column. The rectangular collector column 1102 and the hexagonal thermal structure 1104 intersect in the first portion 1202 of the collector column 1102. Accordingly, the first portion 1202 is common to both the thermal structure 1104 and the collector column 1102. That is, the first portion 1202 comprising the bottom layers 1318, 1320, 1322, 1324 is part of both the thermal structure 1104 and the thermal column 1102. It should be noted that in some embodiments, the metal layers 1318, 1320, 1322 are used to carry signals to terminals of the components of the device 1100, including to and from the heat sources 104. Therefore, while not shown in the figures for the sake of simplifying the figures, portions of the metal layers 1318, 1320, 1322 may be present above the heat sources and other components of the device 1100. As noted above with regard to FIG. 3, insulating material may be used to fill the spaces between metal layers 1318, 1320, 1322, 1324 in between the vias 1316. In some such cases, those portions of the metal layers that conduct signals, etc. are not electrically connected to the portions of the metal layers 1318, 1320, 1322 that conduct heat through the collector column 1102. This will be true for other figures depicting the cross sections of the devices discussed herein. Furthermore, it should be noted that components, including the heat sources 104 are typically fabricated in semiconductor material that lies between the box layer 106 and the metal layers 1318, 1320, 1322. Such semiconductor material may be etched away in places in the device 1100 in which there are no components during fabrication of the components. The details of such semiconductor material are omitted from the figures for the sake of simplifying the figures. Still further, the relative thickness of each layer shown is not to scale. Therefore, no conclusions should be drawn regarding the relative thickness of each layer with respect to the other layers of the device 1100.

Figure 13B:
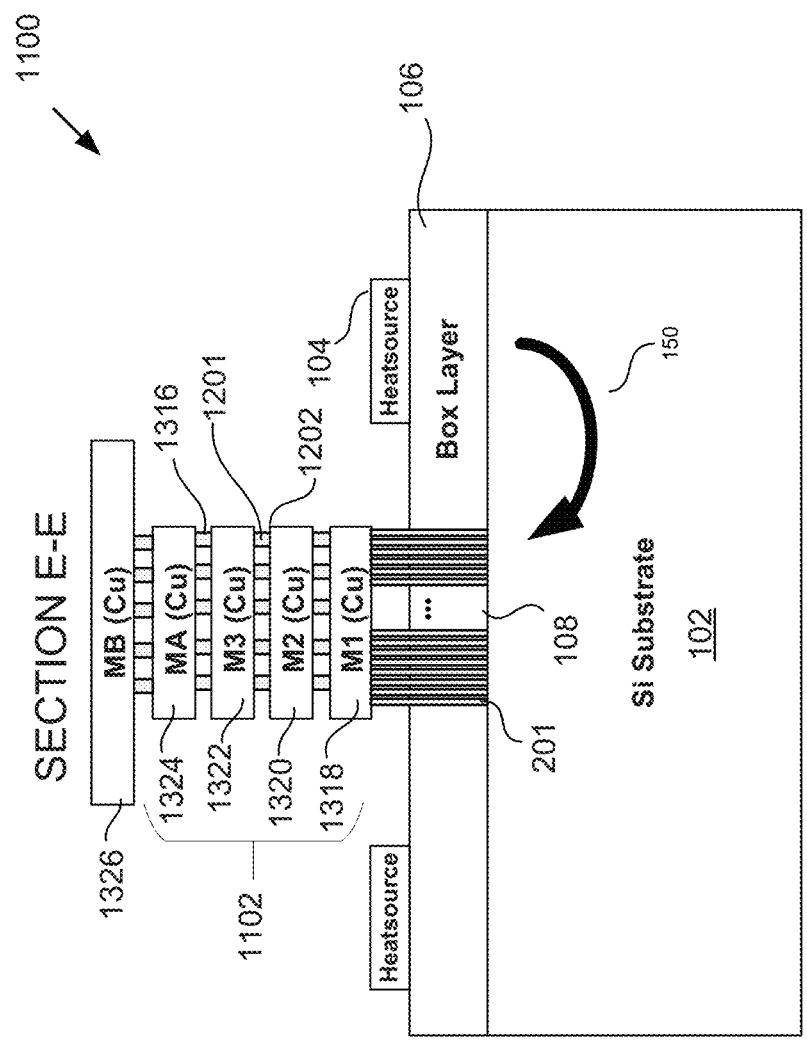
FIG. 13B is an illustration of the layers along a cross-section E-E of the device shown in FIG. 12.

FIG. 13B is an illustration of the layers 102, 106, 1318, 1320, 1322, 1324 along the cross-section E-E of the device shown in FIG. 12. It should be noted that in some embodiments, not all of the layers 1318, 1320, 1322, 1324 (four in the example shown) need to run the full extent of the collector column 1102. However, there should be a contiguous thermal conduction path via the layers 1318, 1320, 1322, 1324 by which heat can be conducted from one end of the collector column 1102 to the other. In particular, there should be a contiguous thermal path from the S-contacts 201 that are disposed below the M1 layer 1318 to the MA layer 1324 under the thermal structure 1104. Furthermore, the closer the S-contacts 201 are to the heat source, the more effective the collector column 1102 will be in conducting heat from the source 104 to the thermal structure 1104.

S-contacts 201 provide a thermally conductive path through the sink BOX layer 108. In the example shown in FIG. 13A, the heat sources 104 are not fabricated underneath the thermal structure 1104, but rather are adjacent to the collector column 1102. Providing S-contacts 201 in a highly dense configuration along the collector column 1102 provides a substantial number of independent low thermal resistance pathways between the substrate 102 and the thermally conductive layers of the collector column 1102. Heat flows as indicated by a series of smaller arrows 1107 in FIG. 11, from heat sources 104 through the substrate 102 to S-contacts 201 that are placed along the collector column 1102. It should be noted that the S-contacts 201 in some embodiments are not be spread over the entire length and width of the thermal collector 1102. In some such embodiments, the S-contacts may be placed under the collector column near the heat sources 104. Heat then flows up through the S-contacts 201 to the collector column 1102. Heat is then conducted along the collector column 1102 to the thermal structure 1104, as indicated by the larger arrows 1109 in FIG. 11. The thermal structure 1104 can be coupled to a heat sink external to the semiconductor device 1100 to remove heat from the semiconductor device 1100.

One consequence of fabricating a collector column 1102 and placing a highly dense configuration of S-contacts along the collector column 1102 is that a substantial amount of area underneath the second portion 1203 of the thermal structure 1104 that lies on each side of the collector column 1102 is freed up for use in fabricating components of the semiconductor device 1100, including active components such as transistors, etc. The thermal resistance to heat flowing from the heat sources 104 to the thermal structure 1104 is relatively low due to the heat conduction path through the collector column 1102 and the thermal structure 1104.

Figure 14:
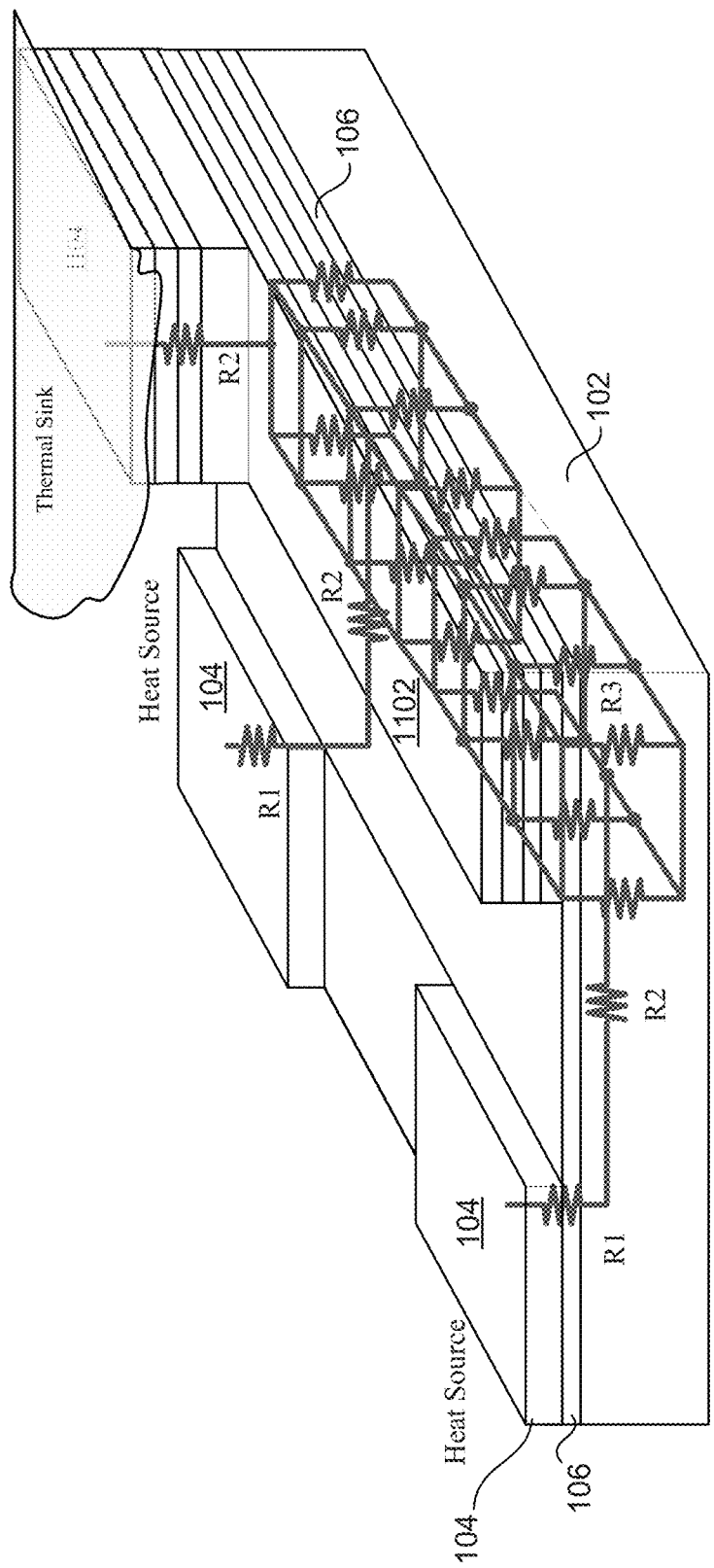
FIG. 14 is an illustration of the thermal schematic of a device having a collector column with multiple S-contacts.

FIG. 14 is an illustration of the thermal schematic of a device 1100 having a collector column 1102 with multiple S-contacts 201. Heat generated by the heat sources 104 flows down through the box layer 106, represented by a thermal resistance R1. The heat then flows through the substrate 102, represented a thermal resistance R2. The matrix of S-contacts 201 represented by thermal resistance R3 (only one labeled) provides a plurality of parallel paths from the substrate 102 through the box layer 106 to the collector column 1102. The collector column 1102 then conducts the heat to the thermal structure 1104. The thermal structure 1104 is then coupled mechanically and thermally to a thermal sink. The matrix of parallel S-contacts 201 provide a relatively low thermal resistance through the box layer 106 due to the substantial number of such S-contacts that are provided under the collector column 1102.

In some embodiments, the heat sources 104 are moved close to the thermal column 1102. In some embodiments in which the heat sources 104 are amplifiers, moving the amplifiers close reduces the LC loop resonance (i.e., the amount of inductance in series with the source of a FET used to form the amplifier), thus improving the stability of the amplifiers. In addition, capacitors can be added under the heat structure 1104 that further improve the stability of the amplifiers. Also, by freeing some of the area under the thermal structure 1104, signals can be routed more directly under the thermal structure 1104.

Figure 15:
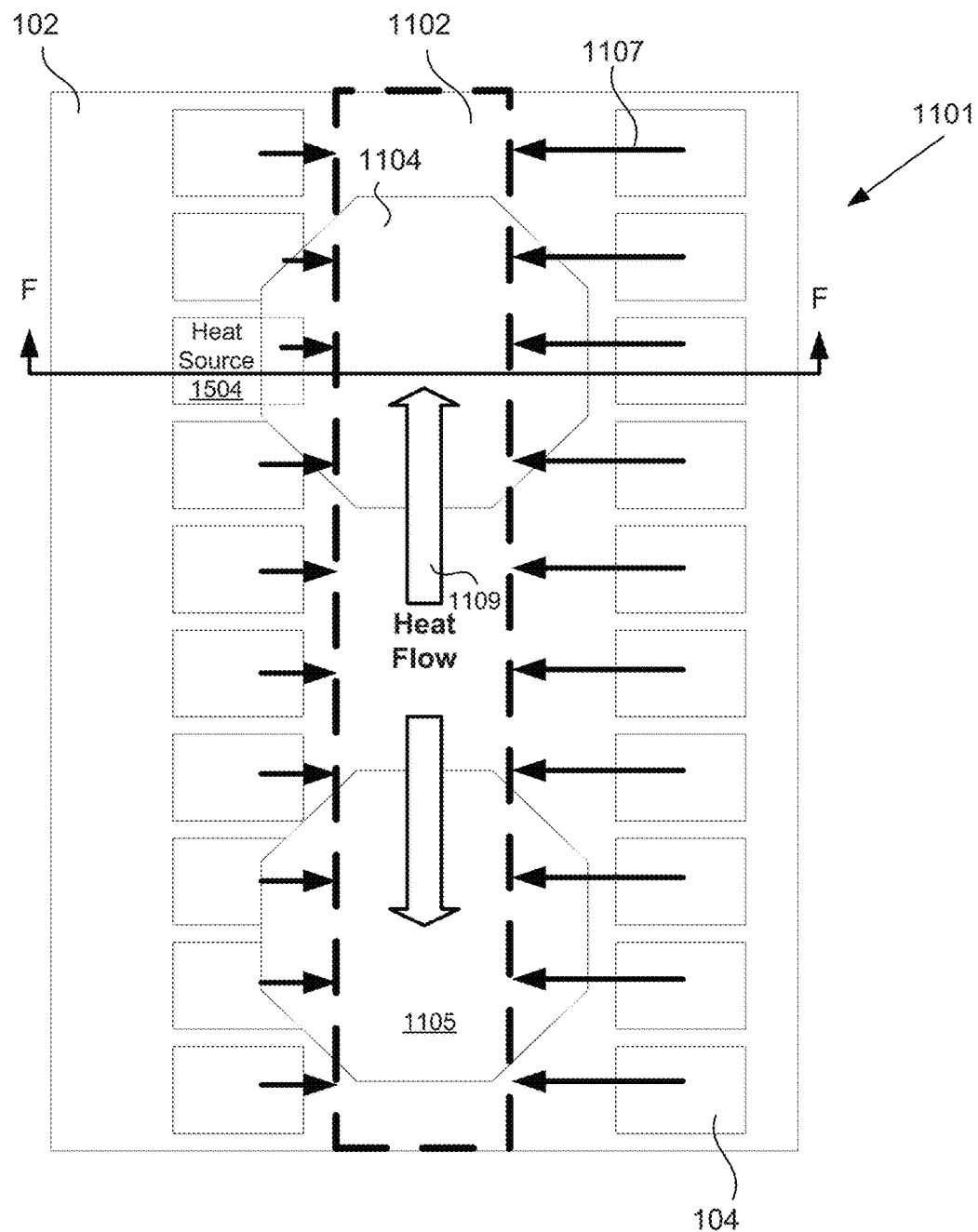
FIG. 15 shows a device having heat sources that have been fabricated partially beneath the second portion of the thermal structure.
Figure 16:
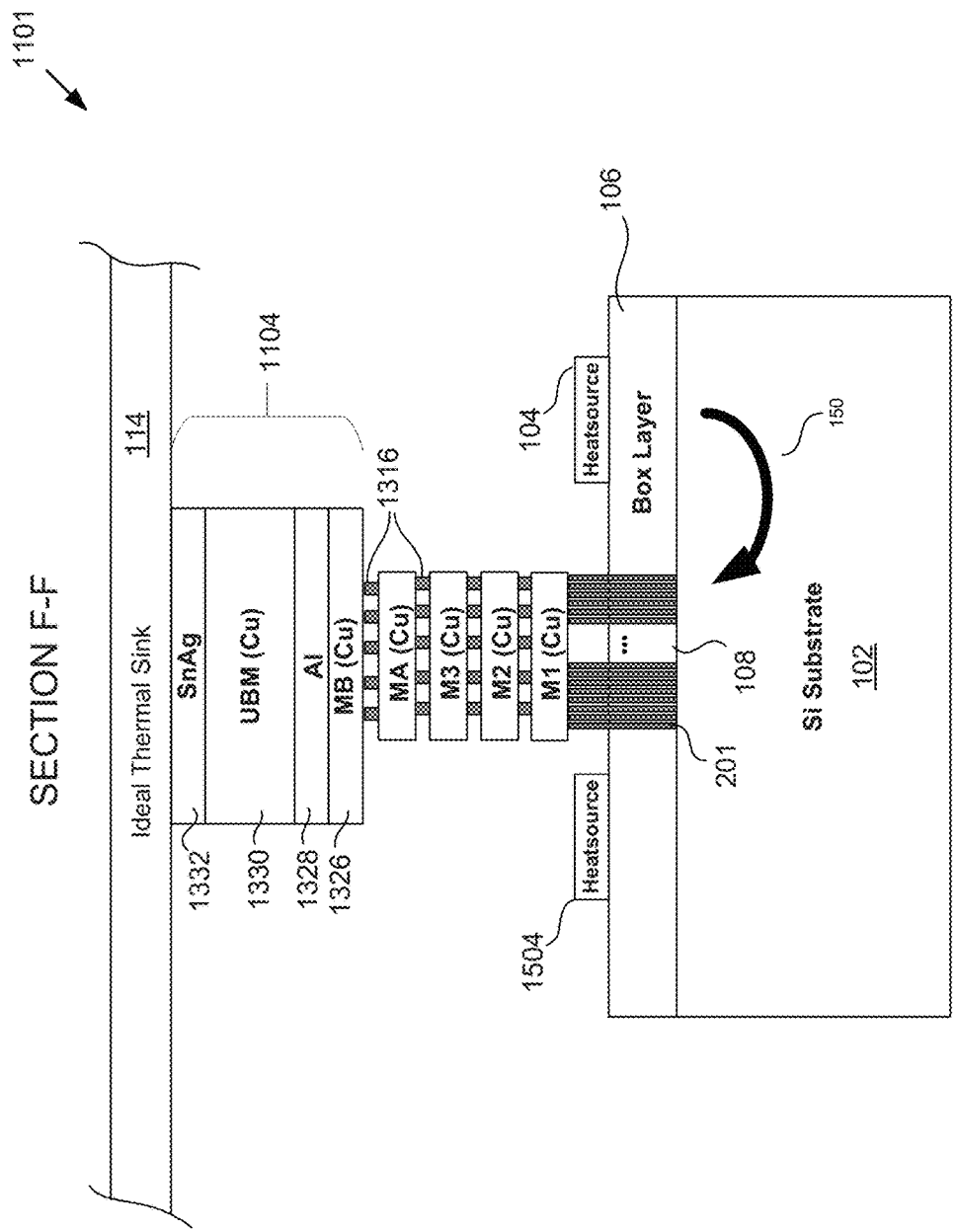
FIG. 16 shows the cross section of the device along line F-F.

FIG. 15 shows a device 1101 having heat sources 1504 that have been fabricated partially beneath the second portion 1203 of the thermal structure 1104. FIG. 16 shows the cross section of the device 1101 along line F-F. The S-contacts 201 that are formed under the collector column are not shown in FIG. 15 for the sake of clarity and simplicity.

Figure 17:
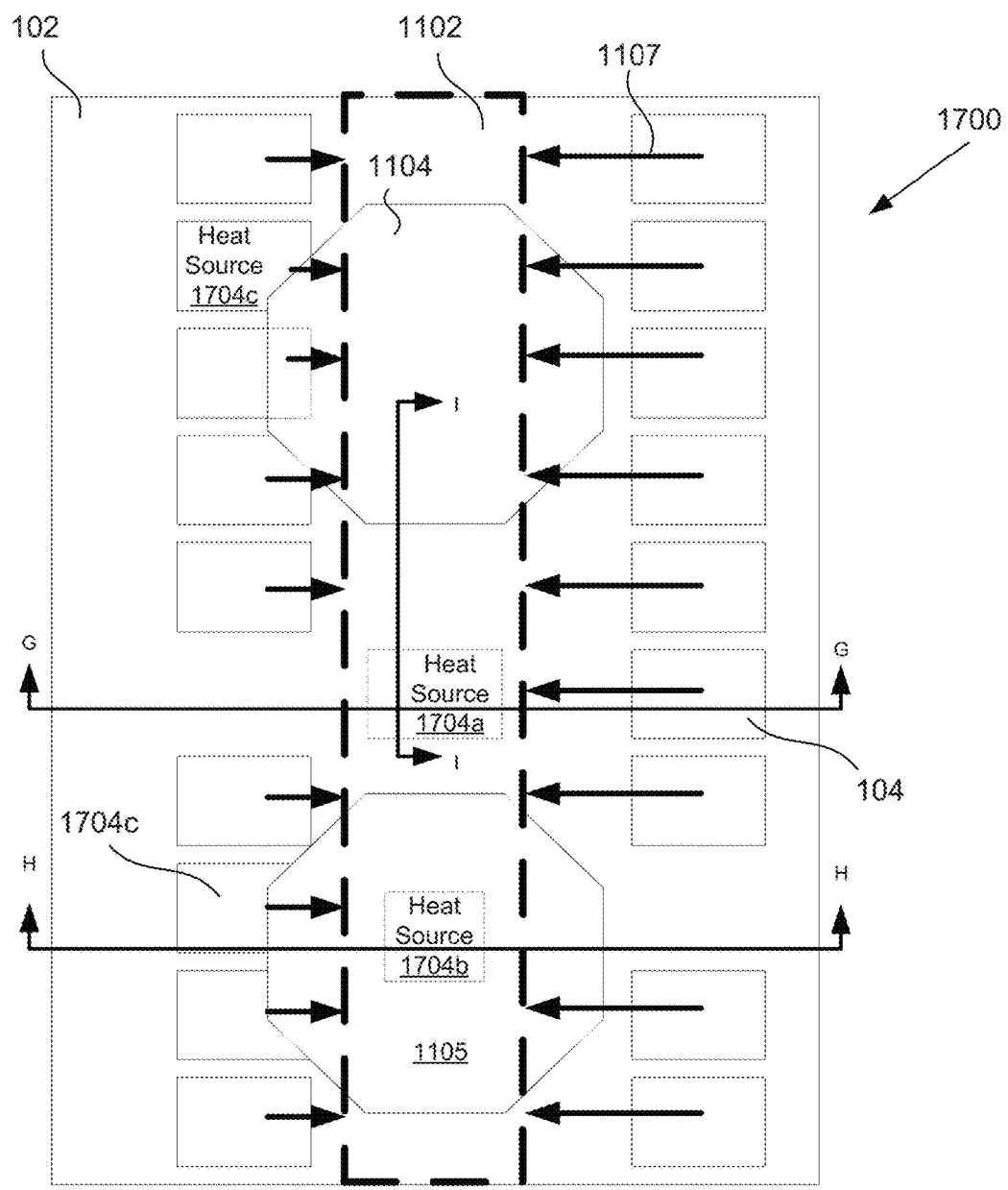
FIG. 17 illustrates a device in which a first heat source is fabricated under the collector column at a place outside the thermal structures and a second heat source is fabricated completely under the thermal structure.
Figure 18:
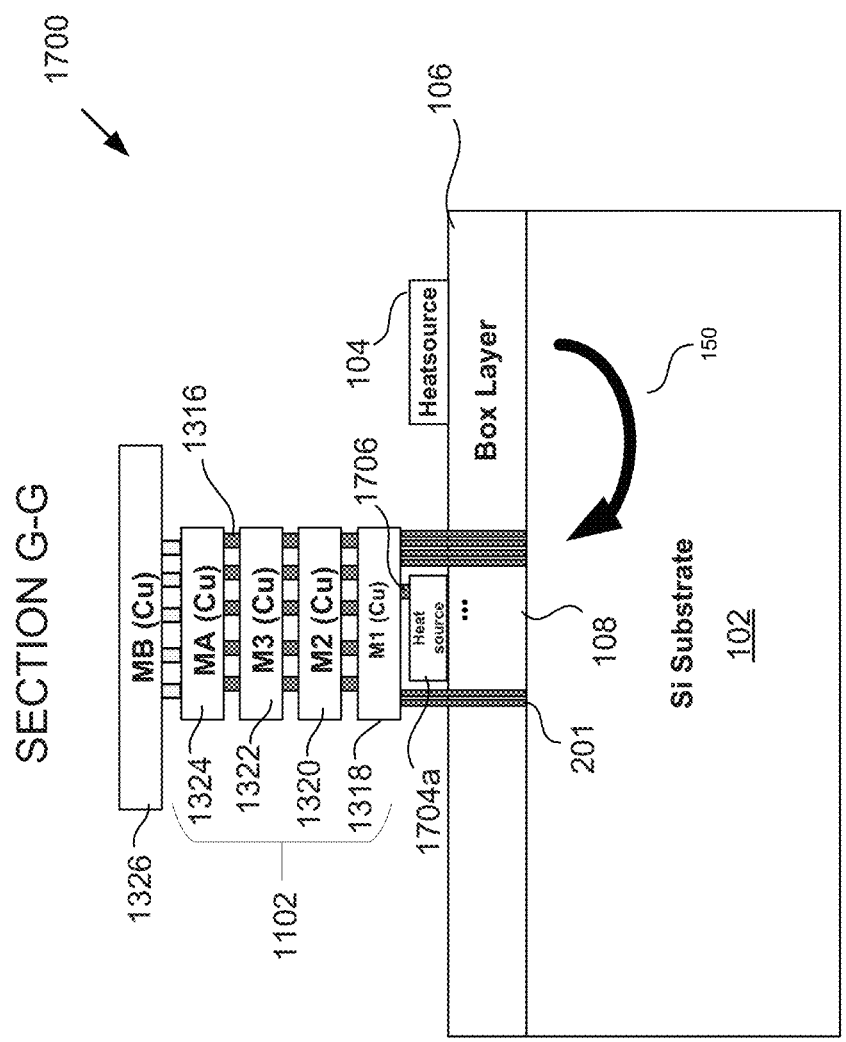
FIG. 18 illustrates a cross-section of the device taken along line G-G.

FIG. 17 illustrates a device 1700 in which a first heat source 1704a is fabricated under the collector column 1102 at a place outside the thermal structures 1104, 1105. FIG. 18 illustrates a cross-section of the device 1700 taken along line G-G. As noted above, the heat source 1704a can be electrically connected to one or more of the metal layers 1318, 1320, 1322, 1324 to provide electrical connections to the heat source. A via 1706 is shown connecting the heat source to the metal layer 1318. In some embodiments, the via connects to an electrical connection of the heat source 1704a, such as the source of a field effect transistor (FET) that is to be coupled to ground. In some such embodiments, each of the metal layers 1318, 1320, 1322, 1324, 1326 may be coupled to ground. Therefore, the via 1706 can serve as a heat conduction path directly to the metal layers 1318, 1320, 1322, 1324, 1326 and up through them to the collector column 1104 that routes the heat to ground 114 (see FIG. 19). In some such embodiments, the heat sink 114 is also electrical ground. In other embodiments, a similar conduction path from the heat source through a via 1706 can be made to the metal layers which are coupled to a power supply. In such cases, the power supply can serve as the heat sink 114. Other connections to the metal layers are not shown for the sake of simplicity. In this case, heat may be conducted directly up to the thermal structure 1104, 1105 through the metal layers 1318, 1320, 1322, 1324. However, some heat may still be dissipated down through the box layer 106, back up through the S-contacts 201 and then up through the metal layers 1318, 1320, 1322, 1324. Nonetheless, the heat generated by other heat sources 104 may yet conduct through the substrate 102 to the S-contacts and along the collector column 1102 to the thermal structure 1104, 1105.

Figure 19:
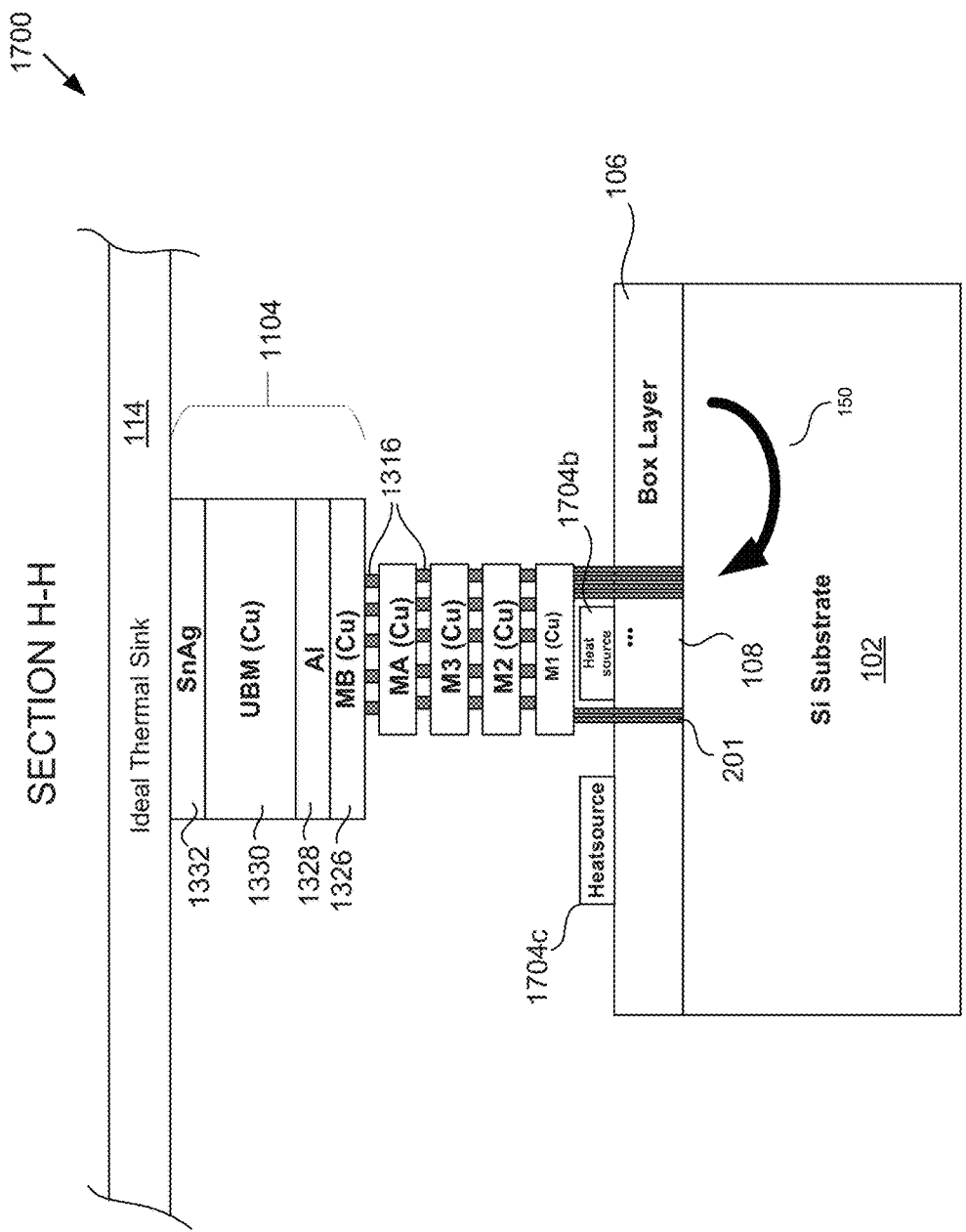
FIG. 19 illustrates the cross-section of the device along line H-H

A second heat source 1704b is fabricated under the thermal structure 1105. FIG. 19 illustrates the cross-section of the device 1700 along line H-H. A third heat source 1704c is shown partially under the thermal structure 1104. Note that in the embodiment shown in FIG. 19, the heat source 1704b is not shown with a via connection. In this case, any via connections (not shown) would not be to either a power supply or to ground directly. Therefore, heat flows from the heat source 1704b through the box layer 106 to the substrate 102 and to the S-contacts 201 and then up through the S-contacts to the metal layers 1318, 1320, 1322, 1324 to the thermal structure 1104.

Figure 20:
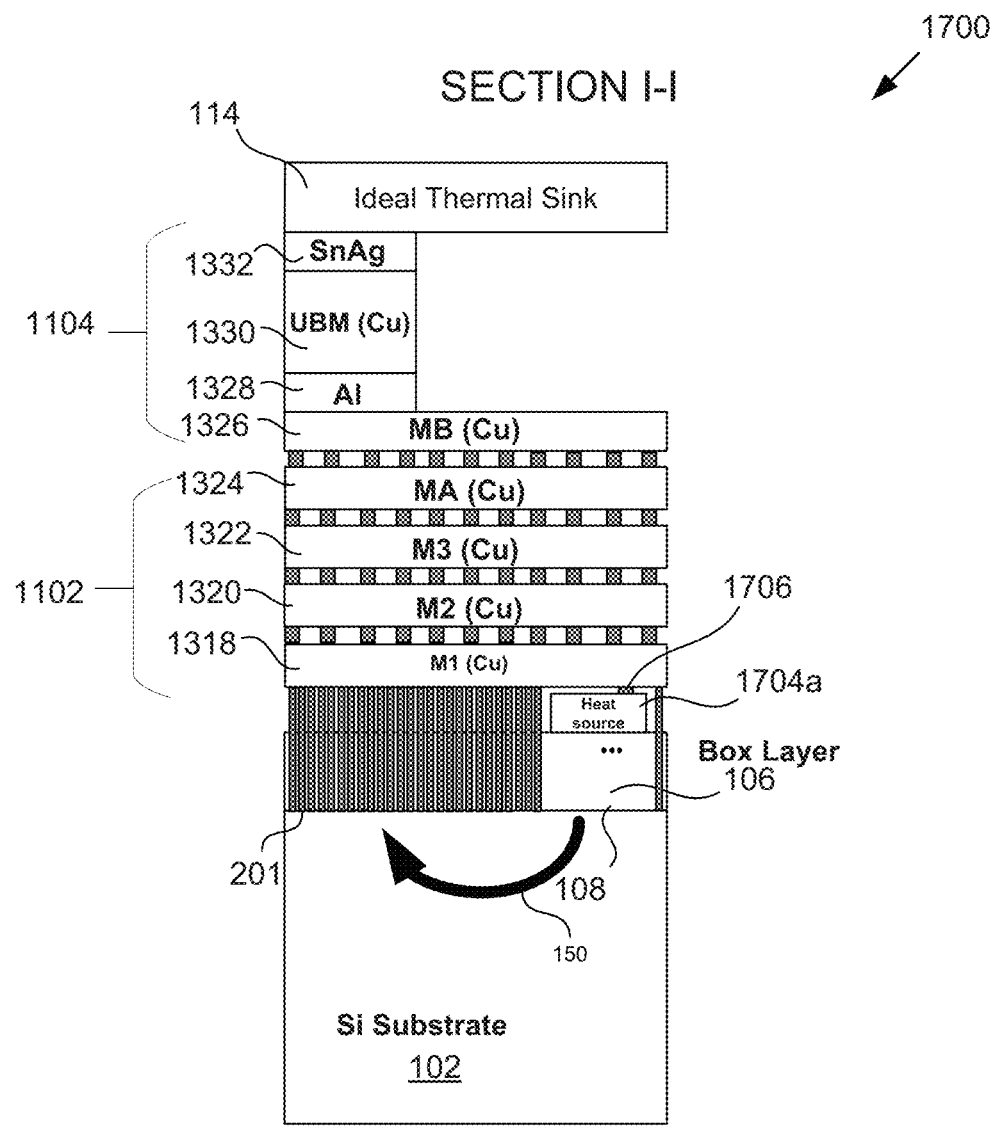
FIG. 20 is an illustration of a cross-section of one embodiment of device along the line I-I.

FIG. 20 is an illustration of a cross-section of one embodiment of device 1700 along the line I-I. The collector column 1102 runs the length of the cross section. In addition, it can be seen that each layer 1318, 1320, 1322, 1324 runs the full length of the collector column 1102. A heat source 1704a is fabricated under the collector column 1102.

Figure 21:
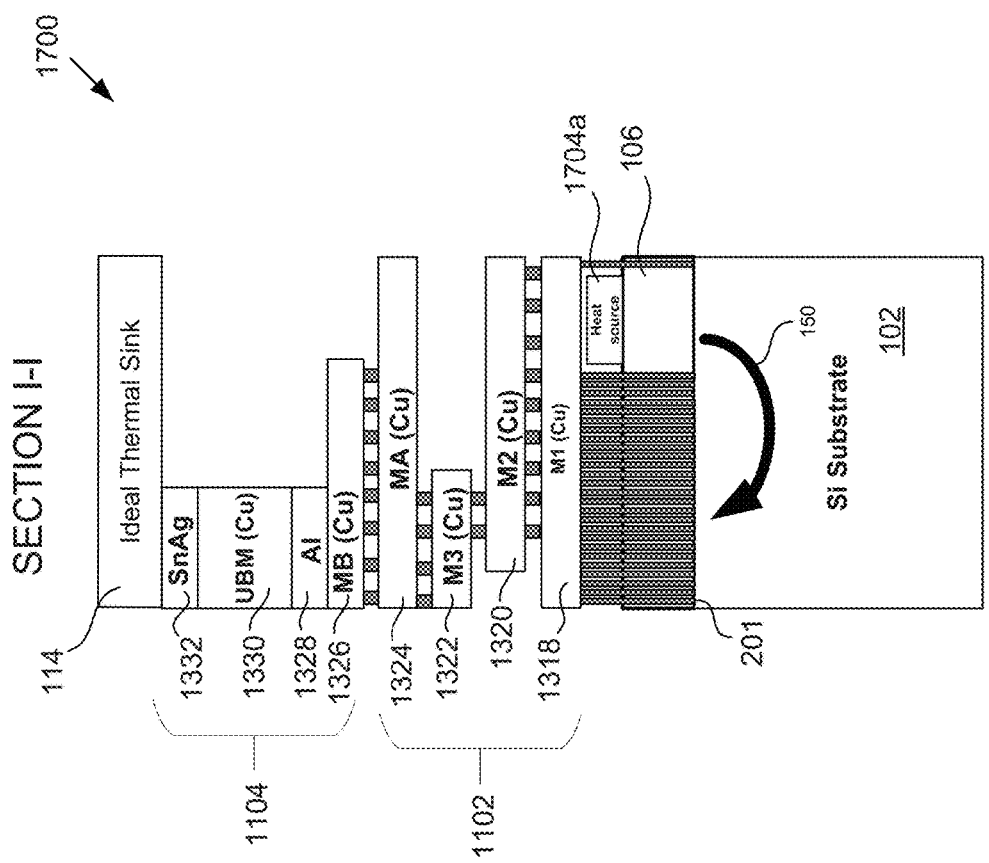
FIG. 21 is an illustration of a cross-section of another embodiment of the device taken along the same line I-I as shown in FIG. 20.

FIG. 21 is an illustration of a cross-section of another embodiment of the device 1700 taken along the same line I-I as shown in FIG. 19. However, while the collector column 1102 in the embodiment depicted in FIG. 21 runs the full length of the line I-I, two layers 1320, 1322 do not run over the entire length of the line I-I. That is, the M2 layer 1320 does not go under the entire heat structure 1104, but rather there is a break in the M2 layer 1320. Similarly, the M3 layer 1322 runs under the entire heat structure 1104, but stops before the heat source 1704a. At other points along the collector column that lie outside the line I-I, one or more of the metal layers 1318, 1320, 1322, 1324 may be present or not, depending on the needs of the device layout. However, a contiguous path is provided for heat conduction from the substrate 102 through the S-contacts 201 to the thermal sink 114 through the layers 1318, 1320, 1322, 1324 and the layers of the heat structure 1104. It should be noted that the M3 layer 1322 may be present further along the collector column toward the heat source 1704b (not shown in FIG. 21). Similarly, the M2 layer 1320 may be present at a point further along the collector column 1102 further away from the heat source 1704a (either under the heat structure 1104 or on the other side of the heat structure 1104).

Figure 22:
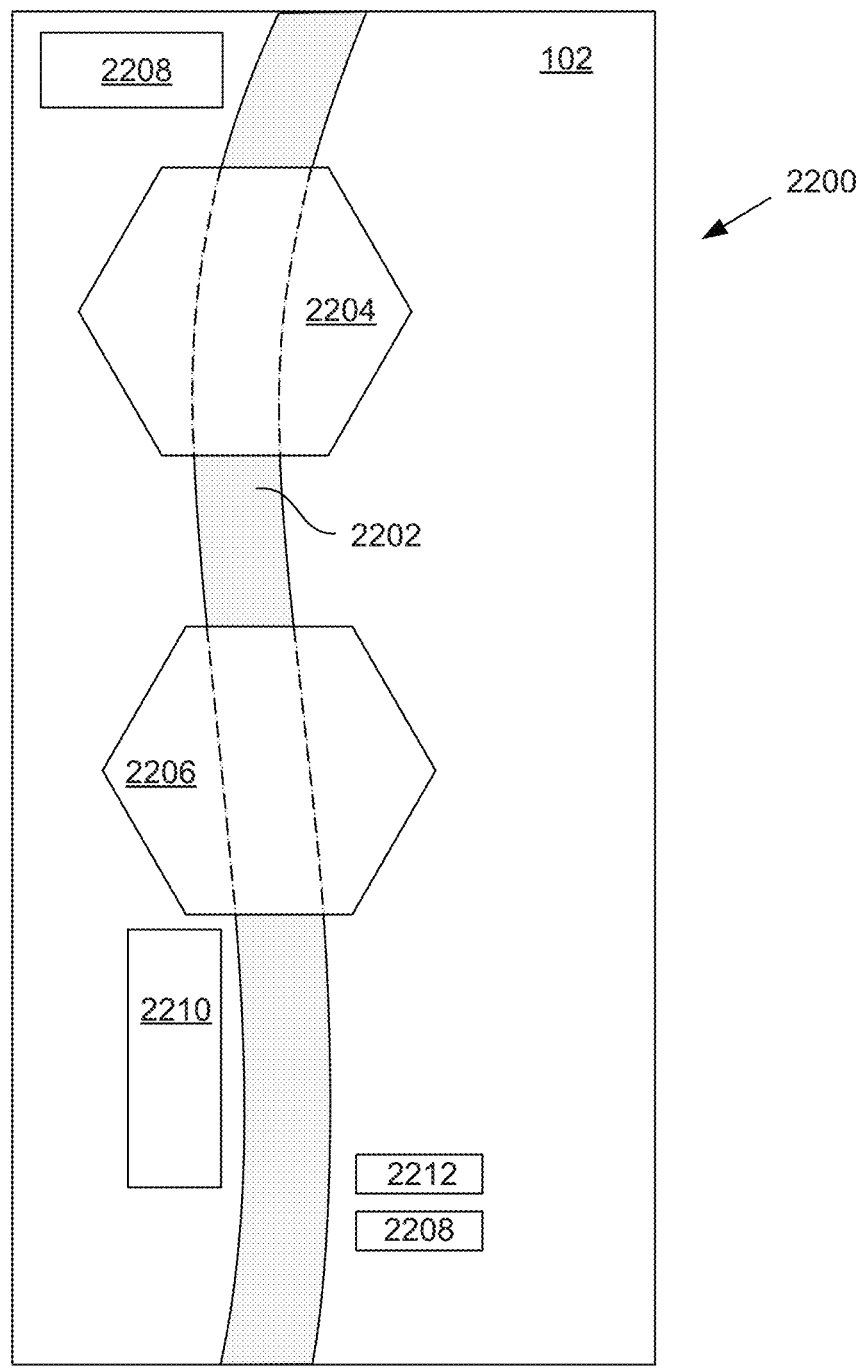
FIG. 22 is an illustration of an alternative embodiment of a semiconductor device having a collector column that curves along a path between each of two thermal structures and around a plurality of heat sources.

FIG. 22 is an illustration of an alternative embodiment of a semiconductor device 2200 having a collector column 2202 that is customized to curve along a path between each of two thermal structures 2204, 2206 and around a plurality of heat sources 2208, 2210, 2212. Heat that is generated in the heat sources 2208, 2210, 2212 flows through the substrate 102 to S-contacts (not shown for simplicity in FIG. 22) that lie between the bottom layer of the collector column 2202 and the substrate 102. The S-contacts 201 conduct the heat up to the heat conducting layers of the collector column 2202. The heat conducting layers of the collector column 2202 provide a thermally conductive path from the S-contacts 201 to the heat structures 2204, 2206. The shape and width of the collector column 2202 and the number and placement of S-contacts 201 along the collector column 2202 can be adapted to the particular heat sources and other components and signal conductors to be fabricated on the semiconductor device 2200. Furthermore, the width of the collector column 2202 need not be uniform over the length of the collector column 2202. Accordingly, at various locations along the collector column 2202, the can be made wider to accommodate receiving heat from heat sources on both sides of the collector column 2202.

Figure 23:
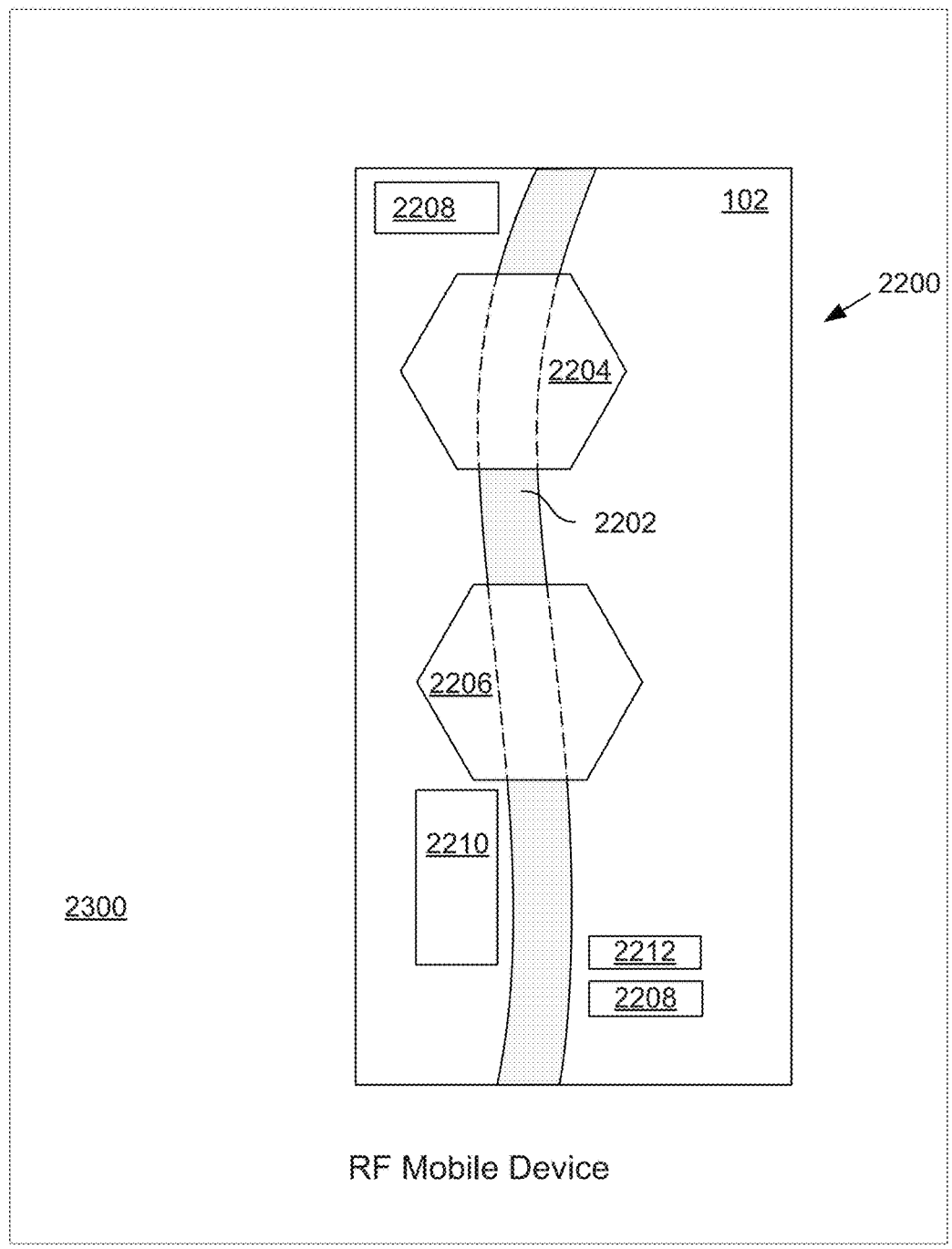
FIG. 23 is an illustration of an RF mobile device having a semiconductor with a collector column and S-contacts.

FIG. 23 is an illustration of an RF mobile device 2300 having a semiconductor 2200 with a collector column and S-contacts.

Methods

Figure 24:
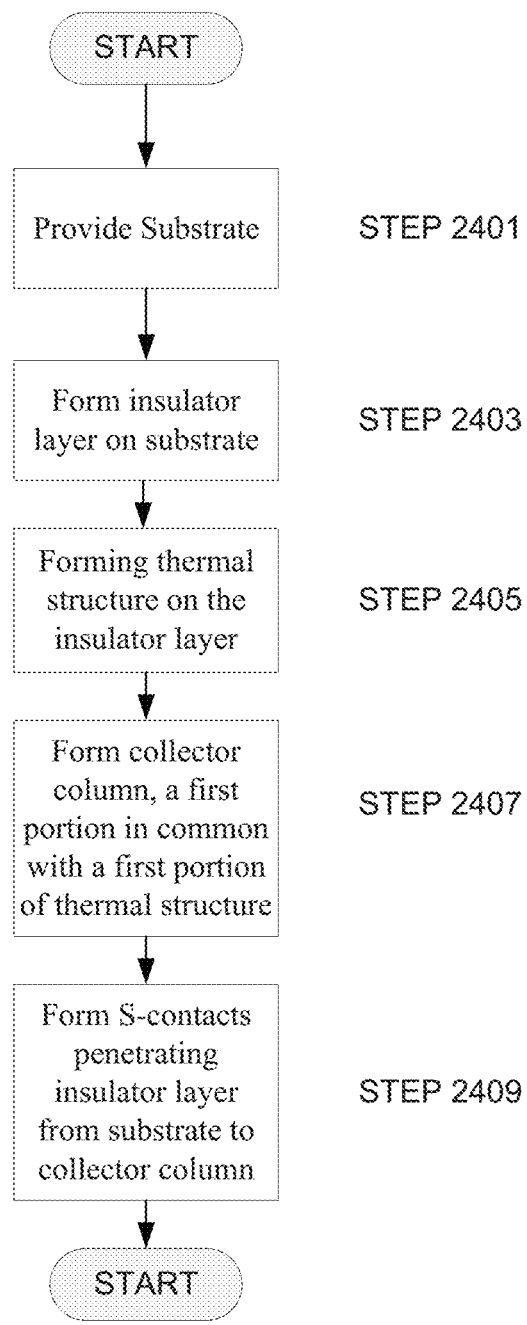
FIG. 24 is an illustration of another aspect of the disclosure that includes a method for forming a semiconductor device.

FIG. 24 is an illustration of another aspect of the disclosure that includes a method for forming a semiconductor device. The method includes: providing a substrate (STEP 2401); forming an insulator layer on the substrate (STEP 2403); forming a thermal structure on the insulator layer, wherein the thermal structure has a first and second portion (STEP 2405); forming a collector column having a first and second portion, wherein the first portion of the collector column is common with the first portion of the thermal structure (STEP 2407); and forming a plurality of S-contacts 201 penetrating the insulator layer to thermally connect the substrate with the collector column (STEP 2409).

Other aspects of the above method include: forming at least one heat source upon the insulator layer, each heat source being spaced apart from the thermal structure; the thermal structure comprising a plurality of thermally conductive layers; at least some of the layers of the thermal structure comprising silicon, aluminum, tungsten, and/or copper; the plurality of S-contacts 201 comprising at least 100 such S-contacts 201; the plurality of S-contacts 201 comprising at least 500 such S-contacts 201; the plurality of S-contacts 201 comprising at least 1000 such S-contacts 201; the plurality of S-contacts 201 comprising at least 5000 such S-contacts 201; the plurality of S-contacts 201 being independent parallel thermal conduction paths between the substrate and the thermal structure; the plurality of S-contacts 201 having a density such that approximately 15% of the area that underlies the thermal structure is thermally coupled through to the substrate; and the plurality of S-contacts 201 having a density such that the thermal conductivity between the thermal structure and the substrate is greater than about 26.1 Watts per meter Kelvin.

Fabrication Technologies and Options

As should be readily apparent to one of ordinary skill in the art, various embodiments of the claimed invention can be implemented to meet a wide variety of specifications. Unless otherwise noted above, selection of suitable component values is a matter of design choice and various embodiments of the claimed invention may be implemented in any suitable IC technology (including but not limited to MOSFET and IGFET structures), or in hybrid or discrete circuit forms. Integrated circuit embodiments may be fabricated using any suitable substrates and processes, including but not limited to standard bulk silicon, silicon-on-insulator (SOI), GaN HEMT, GaAs pHEMT, $Al_2O_3$, and MESFET technologies. However, the inventive concepts claimed are particularly useful with an SOI-based fabrication process (including SOS), and with fabrication processes having similar characteristics.

A number of embodiments of the claimed invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion. It is to be understood that the foregoing description is intended to illustrate and not to limit the scope of the claimed invention, which is defined by the scope of the following claims, and that other embodiments are within the scope of the claims.

What is claimed is:

1. A semiconductor device comprising:
   a substrate;
   an insulator layer on the substrate;
   a plurality of heat sources fabricated on top of the insulating layer, such that the insulating layer resides between the heat sources and the substrate;
   a plurality of thermal structures on the insulator layer, each having a plurality of layers stacked one upon another to form the thermal structures between the insulating layer and a heat sink, each of the thermal structures having a first portion and a second portion, each of the layers of the second portion of each thermal structure formed of the same layer as one of the layers of the first portion of that thermal structure;
   a collector column having a plurality of layers stacked one upon another to form the collector column, such that the insulating layer resides between the collector column and the substrate, the collector column having a plurality of first portions and a second portion, each of the layers of the second portion formed of the same layer as a corresponding one of the layers of each first portion, one of the first portions of the collector column being in common with the first portion of one of the thermal structures, and another of the first portions of the collector column being in common with the first portion of another one of the thermal structures, the second portion of the collector column not in common with the thermal structures; and
   a plurality of substrate contacts ("S-contacts") penetrating the insulator layer to thermally connect the substrate with the collector column.

2. The semiconductor device of claim 1, wherein at least some of the S-contacts are spaced over an area that underlies at least a portion of the collector column.

3. The semiconductor device of claim 1, wherein at least some of the S-contacts are not directly under the plurality of thermal structures.

4. The semiconductor device of claim 1, wherein at least one heat source of the plurality of heat sources is spaced apart from the collector column.

5. The semiconductor device of claim 4, wherein the at least one heat source of the plurality of heat sources is spaced a distance from at least one thermal structure of the plurality of thermal structures that is at least twice as long as the largest dimension of the at least one heat source of the plurality of heat sources.

6. The semiconductor device of claim 1, wherein at least one heat source of the plurality of heat sources is beneath the collector column.

7. The semiconductor device of claim 4, wherein the at least one heat source of the plurality of heat sources is beneath at least one thermal structure of the plurality of thermal structures.

8. The semiconductor device of claim 1, further comprising at least one component fabricated of the semiconductor device under the second portion of at least one thermal structure of the plurality of thermal structures and spaced apart from the collector column.

9. The semiconductor device of claim 1, wherein at least one thermal structure of the plurality of thermal structures comprises a plurality of thermally conductive layers, including bottom layers and top layers.

10. The semiconductor device of claim 1, wherein the thermal structure comprises a plurality of thermally conductive layers, including bottom layers and top layers.

11. The semiconductor device of claim 10, wherein at least some of the layers of the at least one thermal structure of the plurality of thermal structures comprise silicon, aluminum, tungsten, and/or copper.

12. The semiconductor device of claim 1, wherein the plurality of S-contacts comprises at least 100 such S-contacts.

13. The semiconductor device of claim 1, wherein the plurality of S-contacts comprises at least 500 such S-contacts.

14. The semiconductor device of claim 1, wherein the plurality of S-contacts comprises at least 1000 such S-contacts.

15. The semiconductor device of claim 1, wherein the plurality of S-contacts comprises at least 5000 such S-contacts.

16. The semiconductor device of claim 1, wherein the plurality of S-contacts are independent parallel thermal conduction paths between the substrate and the collector column.

17. The semiconductor device of claim 1, wherein the plurality of S-contacts has a density such that at least approximately 15% of the area that underlies at least one thermal structure of the plurality of thermal structures is thermally coupled through to the substrate.

18. The semiconductor device of claim 1, wherein the plurality of S-contacts has a density such that the thermal resistance between at least one thermal structure of the plurality of thermal structures and the substrate is less than about 1/26.1 Watts per meter Kelvin.

19. A method for forming a semiconductor device, including:
providing a substrate;
forming an insulator layer on the substrate;
a plurality of heat sources fabricated on top of the insulating layer, such that the insulating layer resides between heat sources and the substrate;
forming a plurality of thermal structures on the insulator layer, each thermal structure having a plurality of layers stacked one upon another to form the thermal structures between the insulating layer and a heat sink, each of the thermal structures having a first portion and a second portion, each of the layers of the second portion formed of the same layer as one of the layers of the first portion of that thermal structure;
forming a collector column having a plurality of layers stacked one upon another to form the collector column, such that the insulating layer resides between the collector column and the substrate, the collector column having at least a plurality of first portions and a second portion, each of the layers of the second portion formed of the same layer as a corresponding one of the layers of the each first portion, the one of the first portions of the collector column being in common with the first portion of one of the thermal structures, and another of the first portions of the collector column being in common with the first portion of another of the thermal structures, the second portion of the collector column not in common with the thermal structures; and
forming a plurality of S-contacts penetrating the insulator layer to thermally connect the substrate with the collector column and spaced over an area that underlies the collector column.

20. The method of claim 19, wherein at least one heat source of the plurality of heat sources is spaced apart from the collector column.

21. The method of claim 19, wherein at least one thermal structure of the plurality of thermal structures comprises a plurality of thermally conductive layers.

22. The method of claim 21, wherein at least some of the layers of the at least one thermal structure of the plurality of thermal structures comprise silicon, aluminum, tungsten, and/or copper.

23. The method of claim 19, wherein the plurality of S-contacts comprises at least 100 such S-contacts.

24. The method of claim 19, wherein the plurality of S-contacts comprises at least 500 such S-contacts.

25. The method of claim 19, wherein the plurality of S-contacts comprises at least 1000 such S-contacts.

26. The method of claim 19, wherein the plurality of S-contacts comprises at least 5000 such S-contacts.

27. The method of claim 19, wherein the plurality of S-contacts are independent parallel thermal conduction paths between the substrate and at least one thermal structure of the plurality of thermal structures.

28. The method of claim 19, wherein the plurality of S-contacts has a density such that at least approximately 15% of the area that underlies at least one thermal structure of the plurality of thermal structures is thermally coupled through to the substrate.

29. The method of claim 19, wherein the plurality of S-contacts has a density such that the thermal resistance between at least one thermal structure of the plurality of thermal structures and the substrate is less than about 1/26.1 Watts per meter Kelvin.

30. An RF mobile device having a semiconductor device comprising:
a substrate;
an insulator layer on the substrate;
a plurality of heat sources fabricated on top of the insulating layer, such that the insulating layer resides between the heat sources and the substrate;
a plurality of thermal structures on the insulator layer, each having a plurality of layers stacked one upon another to form the thermal structures between the insulating layer and a heat sink, each of the thermal structures having a first portion and a second portion, each of the layers of the second portion of each thermal structure formed of the same layer as one of the layers of the first portion of that thermal structure;
a collector column having a plurality of layers stacked one upon another to form the collector column, such that the insulating layer resides between the collector column and the substrate, the collector column having a plurality of first portions and a second portion, each of the layers of the second portion formed of the layers of each first portion, one of the first portions of the collector column being in common with the first portion of one of the thermal structures, and another of the first portions of the collector column being in common with the first portion of another one of the thermal structures, the second portion of the collector column not in common with the thermal structures; and a plurality of substrate contacts ("S-contacts") penetrating the insulator layer to thermally connect the substrate with the collector column and spaced over an area that underlies the collector column.

* * * * *